(12) United States Patent
Sakata

(10) Patent No.: US 11,107,722 B2
(45) Date of Patent: Aug. 31, 2021

(54) THIN-PLATE SUBSTRATE HOLDING FINGER AND TRANSFER ROBOT PROVIDED WITH SAID FINGER

(71) Applicant: Rorze Corporation, Hiroshima (JP)

(72) Inventor: Katsunori Sakata, Fukuyama (JP)

(73) Assignee: Rorze Corporation

( * ) Notice: Subject to any disclaimer, the term of this patent is extended or adjusted under 35 U.S.C. 154(b) by 63 days.

(21) Appl. No.: 16/611,729

(22) PCT Filed: Apr. 23, 2018

(86) PCT No.: PCT/JP2018/016406
§ 371 (c)(1),
(2) Date: Nov. 7, 2019

(87) PCT Pub. No.: WO2018/207599
PCT Pub. Date: Nov. 15, 2018

(65) Prior Publication Data
US 2020/0101624 A1    Apr. 2, 2020

(30) Foreign Application Priority Data

May 11, 2017 (JP) .............................. JP2017-094316

(51) Int. Cl.
*H01L 21/687* (2006.01)
*B25J 15/08* (2006.01)
(Continued)

(52) U.S. Cl.
CPC ..... *H01L 21/68707* (2013.01); *B25J 11/0095* (2013.01); *B25J 15/08* (2013.01);
(Continued)

(58) Field of Classification Search
CPC . B25J 11/0095; B25J 15/08; H01L 21/67017; H01L 21/67706; H01L 21/67766; H01L 21/68707; Y10S 414/141
See application file for complete search history.

(56) References Cited

U.S. PATENT DOCUMENTS 5,431,421 A * 7/1995 Thompson ........ H01L 21/67023
   118/503
6,109,677 A * 8/2000 Anthony .............. B25J 15/0253
   294/103.1
(Continued)

FOREIGN PATENT DOCUMENTS

JP    09-330972    12/1997
JP    2007-329447    12/2007
(Continued)

OTHER PUBLICATIONS

International Search Report dated May 29, 2018 issued in connection with International Application No. PCT/JP2018/016406, 2 pages.

*Primary Examiner* — James Keenan
(74) *Attorney, Agent, or Firm* — Merek, Blackmon & Voorhees, LLC

(57) ABSTRACT

Provided is holding finger 21 with which a thin-plate substrate W that has been subjected to surface processing can be transferred without generating a natural oxide film on a surface to be processed of the thin-plate substrate W. The holding finger 21 comprises: a finger body 47 which is internally formed with a flow path for circulating an inert gas; a pipe member which provides communication between an inert gas supply source and the flow path; an ejection port for ejecting the inert gas onto the surface to be processed of the thin-plate substrate W, the ejection port communicating with the flow path and being disposed on a surface of the finger body 47 opposing the surface to be processed of the (Continued)

thin-plate substrate W; an abutting member 49 which is disposed on the surface of the finger body 47 on which the ejection port is formed, and which abuts a peripheral portion of the thin-plate substrate W; a clamp member 57 which is disposed to be movable forward and backward with respect to the thin-plate substrate W; and a clamp mechanism for the clamp member 57 forward and backward.

20 Claims, 14 Drawing Sheets

(51) Int. Cl.
     *H01L 21/677*      (2006.01)
     *B25J 11/00*      (2006.01)

(52) U.S. Cl.
     CPC .. *H01L 21/67706* (2013.01); *H01L 21/67766* (2013.01); *Y10S 414/141* (2013.01)

(56) References Cited

U.S. PATENT DOCUMENTS

| | | | | |
|---|---|---|---|---|
| 6,322,116 | B1 * | 11/2001 | Stevens | B25B 9/00 |
| | | | | 294/64.3 |
| 7,963,737 | B2 * | 6/2011 | Ryu | H01L 21/67766 |
| | | | | 414/411 |
| 8,167,521 | B2 * | 5/2012 | Nakao | H01L 21/68707 |
| | | | | 414/172 |
| 10,283,393 | B1 * | 5/2019 | Liu | H01L 21/67309 |
| 10,354,903 | B2 * | 7/2019 | Sakata | H01L 21/67393 |
| 10,354,908 | B2 * | 7/2019 | Wu | B25J 15/0014 |
| 10,947,063 | B2 * | 3/2021 | Suzuki | H01L 21/67201 |
| 2005/0163598 | A1 * | 7/2005 | Yuasa | H01L 21/68707 |
| | | | | 414/217 |
| 2007/0209593 | A1 * | 9/2007 | Aggarwal | C23C 16/54 |
| | | | | 118/724 |
| 2017/0125272 | A1 * | 5/2017 | Gogh | H01L 21/6719 |
| 2021/0050242 | A1 * | 2/2021 | Sakata | H01L 21/677 |

FOREIGN PATENT DOCUMENTS

| | | | | | |
|---|---|---|---|---|---|
| JP | 2009032877 | A * | 2/2009 | | H01L 21/67766 |
| JP | 2009-170740 | | 7/2009 | | |
| JP | 2011-159834 | | 8/2011 | | |
| JP | 2013006222 | A * | 1/2013 | | H01L 21/67778 |
| JP | 5448000 | | 3/2014 | | |
| JP | 2015095526 | A * | 5/2015 | | H01L 21/67766 |
| JP | 2015-146349 | | 8/2015 | | |
| WO | 2008/070302 | | 6/2008 | | |
| WO | 2010/137556 | | 12/2010 | | |
| WO | WO-2013179904 | A1 * | 12/2013 | | H01L 21/67766 |

\* cited by examiner

THIN-PLATE SUBSTRATE HOLDING FINGER AND TRANSFER ROBOT PROVIDED WITH SAID FINGER

FIELD OF THE INVENTION

The present invention relates to a thin-plate substrate holding finger, and a transfer robot or transfer device provided with the finger, which purge a substance remaining on a surface of the thin-plate substrate, such as a semiconductor wafer, liquid crystal display panel, organic electroluminescence display panel, or solar cell panel, by supplying inert gas on a surface to be processed of the thin-plate substrate with holding the thin-plate substrate in a transfer device for the thin-plate substrate.

BACKGROUND OF THE INVENTION

Conventionally a space called a mini-environment space to keep an atmosphere inside a device in which the thin-plate substrate is exposed in high cleanliness has been formed in an EFEM (Equipment Front End Module) for transferring the thin-plate substrate by being connected to a processor performing various processes such as film forming or etching on a surface of the thin-plate substrate to prevent floating dust in the air from adhering on the thin-plate substrate. The mini-environment space is a space surrounded by an FFU (Fan Filter Unit), side walls and an air-flowable floor, the space is cleaned by being filled with the air cleaned by the FFU. Further, dust generated in the space is discharged outside the space with the air because the filled clean air is discharged outside the space through the air-flowable floor. According to this, the space where the substrate exists can be maintained in a high cleanliness degree at relatively low cost.

However, in recent years, as miniaturization of circuit line widths progresses rapidly problems that cannot be addressed only by high-cleaning purification based on a conventional realization method have emerged. In particular, the surface of the thin-plate substrate which has been surface-processed by the processor and transported to the closed container reacts with oxygen and moisture contained in the air in the mini-environment space to form a natural oxide film. Due to the presence of the oxide film, a circuit to be formed on the surface of the thin-plate substrate is not sufficiently formed, and as a result, a problem occurs in that a desired operating characteristic cannot be secured. In addition, the chemical substances contained in the reaction gas used in the processor are carried into the closed container in a state of being attached onto a thin-plate substrate to contaminate other thin-plate substrates in the closed container. This has an adverse effect on the processing steps of the above, and causes the deterioration of the yield.

In order to solve such problems, atmosphere replacement devices have been considered to prevent the oxidation on the surface of the thin-plate substrate contained in the closed container by removing the air and contaminants entering the closed container by an air flow of inert gas, and then filling the inside of the closed container with the inert gas. In the patent literature 1, a device for removing contaminants adhered on the surface of semiconductor wafer mounted on a front opening unified pod (FOUP), which is one of closed containers, and for replacing the atmosphere inside the FOUP with an inert gas atmosphere by supplying the inert gas from the purge plate provided to be movable forward and backward with respect to the FOUP to the semiconductor wafer, is disclosed. See FIG. 1 An element for controlling the ejecting force of the inert gas is provided inside the purge plate to supply the inert gas as a laminar flow.

According to this, it is possible to prevent the progress of oxidation on the surface of the semiconductor wafer without adhering dust on the thin-plate substrate contained in the FOUP. However, in the present when miniaturization has advanced to a high degree, it is insufficient only by preventing the oxidation on the surface of the thin-plate substrate contained in the FOUP, and it is required to prevent the oxidation while transporting the thin-plate substrate from the processing device with vacuum atmosphere to the inside of the FOUP. The patent literature 2 is to respond to such the request, the device is so constructed that a passage is provided near the mini-environment space, the inert gas is filled into the mini-environment space, and the inert gas is circulated by the passage. According to this, a falling current of the inert gas supplied from the FFU is sucked from a gas suction opening disposed in a floor surface, and thereafter, supplied into the mini-environment space again by being moved up to the FFU through the passage. See FIG. 2 According to the above construction, because the whole mini-environment space is filled with the inert gas, the thin-plate substrate is no longer exposed to the atmosphere when it passes through the mini-environment space.

PRIOR ART

Patent Literature

Patent literature 1: Japanese Patent No. 5448000
Patent literature 2: Japanese Patent Laid Open Publication No. 2015-146349

DISCLOSURE OF THE INVENTION

Problems to be Solved by the Invention

However, the construction described in the patent literature 2 causes various problems. First, a large quantity of inert gas is necessary to replace the inside of the mini-environment space with the inert gas, thereby increasing the production cost of the thin-plate substrate. In addition, in case of circulating the inert gas inside the mini-environment space, because not only the inert gas but also components of reactant gas brought into the mini-environment space by being remained on surface of the thin-plate substrate circulate through the device, it is necessary to provide with contaminant-treating means such as a chemical filter and so on newly in order to remove the remained reactant gas. Besides, this chemical filter needs to be periodically replaced in order to maintain a high purifying degree. Further, a driving mechanism such as a transfer robot is disposed in the mini-environment space, and an inert gas warmed by heat generated in the driving mechanism circulates without being cooled. Therefore, there is a possibility that the temperature in the space rises more than a predetermined value and causes troubles such as an operation failure and so on to electrical components. Furthermore, because a down flow of the inert gas supplied from the FFU to the inside of the mini-environment space has a too low speed, it is impossible to remove components of the inert gas remaining in details of patterns which are formed on the thin-plate substrate.

The present invention is devised to solve the above-mentioned problems, and aims to provide a holding finger capable of transferring the thin-plate substrate without exposing the surface of the thin-plate substrate to oxidizing atmospheres and a transfer robot with the holding finger at a cheap price.

Means to Solve the Problem

To achieve an aim of the invention, the thin-plate substrate holding finger of an embodiment of the present invention is characterized by having a finger body which is internally formed with a flow path for circulating an inert gas; a piping member which provides communication between an inert gas supply source and the flow path; an ejection port for ejecting the inert gas onto a surface to be processed of the thin-plate substrate, which communicates with the flow path and is disposed on a surface of the finger body opposing the surface to be processed of the thin-plate substrate; an abutting member which is disposed on the surface of the finger body on which the ejection port is formed, and which abuts a peripheral portion of the thin-plate substrate; a clamp member which is disposed to be movable forward and backward with respect to the thin-plate substrate; and a clamp mechanism for moving the clamp member forward and backward. Here, the thin-plate substrate holding finger is configured to hold the thin-plate substrate and to eject the inert gas onto the surface to be processed.

According to the above configuration, the thin-plate substrate holding finger can hold the thin-plate substrate from the side of the surface to be processed and can eject the inert gas toward the surface to be processed of the held thin-plate substrate. As a result, reactive gas components remaining on the surface to be processed of the thin-plate substrate after surface-processing are removed by an ejection of the inert gas. Further, since the surface to be processed of the thin-plate substrate during transferring does not come into contact with the general atmosphere which is the oxidizing atmosphere, a problem that a natural oxide film is formed during transferring can be solved.

In addition, the thin-plate substrate holding finger of an embodiment of the present invention is characterized in that a dimension in the vertical direction including the finger body and the abutting member is smaller than a pitch dimension in the vertical direction of shelf boards on which the thin-plate substrate is placed. According to the above configuration, the thin-plate substrate holding finger can enter the inside of a container for containing the thin-plate substrate while holding the thin-plate substrate and supplying the inert gas. In particular, by replacing the inside of the container with the inert gas in advance, the thin-plate substrate after processing is not exposed to the oxidizing atmosphere, thereby solving the problem of formation of the natural oxide film on the surface to be processed.

Further, the thin-plate substrate holding finger of an embodiment of the present invention is characterized in that the finger body has a purge portion for ejecting the inert gas formed on the thin-plate substrate, and the purge portion has a disk shape having a diameter substantially the same as that of the thin-plate substrate. According to this configuration, the inert gas can be ejected over the entire surface to be processed of the thin-plate substrate being held.

Moreover, the thin-plate substrate holding finger of an embodiment of the present invention is characterized in that a filter is provided between the flow path of the finger body and the ejection port. According to this configuration, dust generated in the flow path is filtered by the filter, so that only a clean inert gas is ejected from the ejection port. Thereby, it is possible to prevent dust from adhering on the surface to be processed of the thin-plate substrate.

Furthermore, the thin-plate substrate holding finger of an embodiment of the present invention is characterized in that a shield member for covering a space formed between the purge portion and the ejection port and for discharging the inert gas filled in the space downward from a peripheral portion of the thin-plate substrate is provided around the purge portion. According to this configuration, a gap between the shield member and the peripheral portion of the thin-plate substrate serves as a fluid seal, thereby preventing the general atmosphere from flowing from the outside of the space to the inside of the space.

Further, the thin-plate substrate holding finger of an embodiment of the present invention is characterized in that an ejection port is provided to be inclined toward the outside of a substrate to be held. Furthermore, the thin-plate substrate holding finger an embodiment of the present invention is characterized in that the ejection port is also provided on the abutting member, and the flow path also communicates with the ejection port formed on the abutting member. According to these configurations, the inert gas is ejected toward the outside of the substrate to be held, thereby enabling quick discharge of the reaction gas remaining on the surface of the thin-plate substrate.

Furthermore, a thin-plate substrate transfer robot claimed of an embodiment of the present invention is characterized by having at least one thin-plate substrate holding finger at the tip of an arm body, an arm body drive mechanism for bending and extending the arm body in a horizontal plane, and an elevating mechanism for elevating and moving the arm body in a vertical direction. Here, setting the thin-plate substrate transfer robot to a clean robot with clean room specifications prevents dust generated from the drive mechanism from flowing out of the transfer robot during operation. According to this, the transfer robot never contaminates the held thin-plate substrate with dust. Further, the thin-plate substrate transfer robot of an embodiment of the present invention is characterized by having a pressure accumulator in addition to the thin-plate substrate transfer robot. According to this configuration, even when the supply of the inert gas is stopped due to a failure or the like, the held thin-plate substrate can be transferred to a target location without being exposed to the general atmosphere.

Further, a thin-plate substrate transfer device of an embodiment of the present invention is characterized by having a transfer space in which the thin-plate substrate transfer robot is disposed; a transfer space forming member which forms the transfer space; a lid opening/closing device which is fixed to the transfer space forming member, mounts a closed container for containing the thin-plate substrate at a predetermined position, and opens and closes a lid for airtightly closing the closed container; and an FFU which is provided on the upper part of the transfer space forming member and supplies clean air to the transfer space as a downflow; and in that an opening is provided on a floor surface of the transfer space to discharge the clean air supplied from the FFU. According to this configuration, the reaction gas removed by the ejection of the inert gas is discharged to the outside of the transfer space along with the downflow of the clean air supplied from the FFU, so the inside of the transfer space is kept clean.

Effects of Invention

According to preferred embodiments of the present invention described above, the thin-plate substrate which the processing is concluded can be transferred in a state where an atmosphere of the surface to be processed is locally replaced. According to this, an atmosphere of the entire space in which the thin-plate substrate is transferred does not have to be replaced, thereby contributing to cost reduction.

PREFERRED EMBODIMENT OF THE INVENTION

Figure 1:
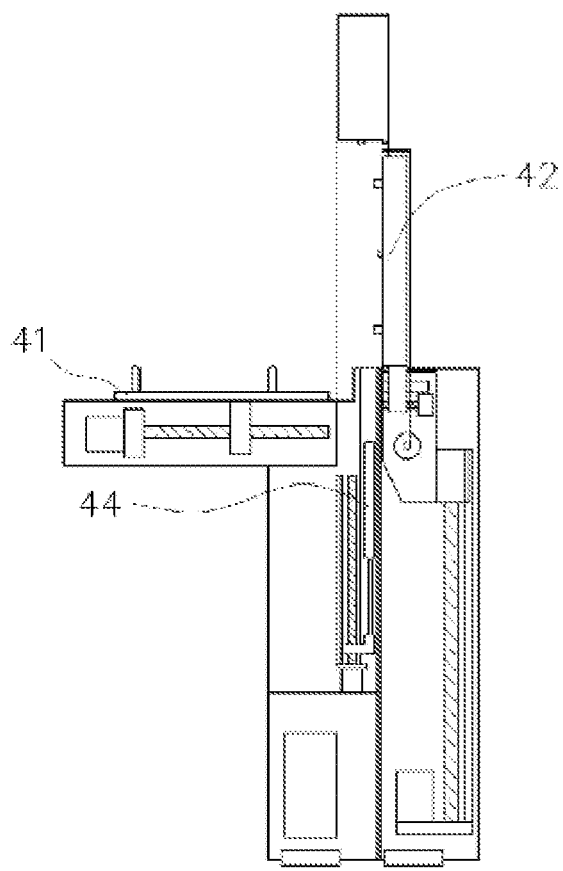
FIG. 1 is a cross-sectional view showing a conventional device for replacing an atmosphere in the FOUP
Figure 2:
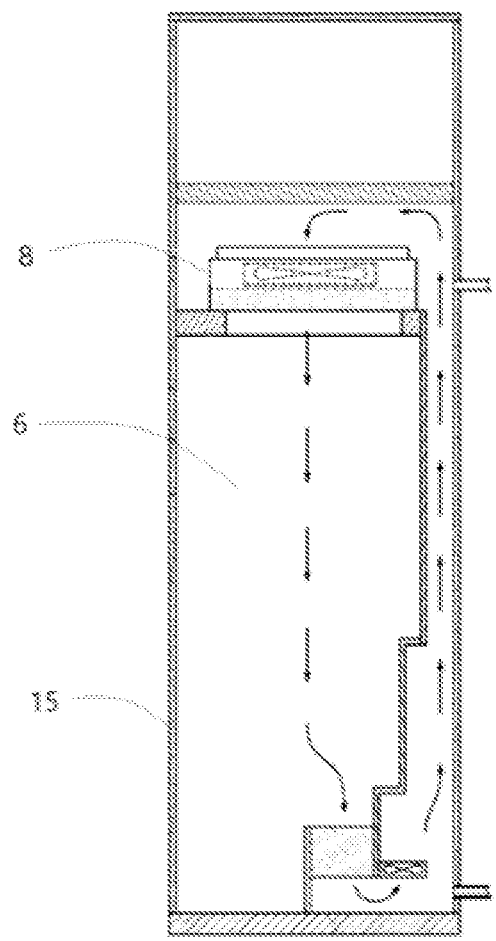
FIG. 2 is a cross-sectional view showing a conventional device for replacing an atmosphere in the mini-environment space.
Figure 3:
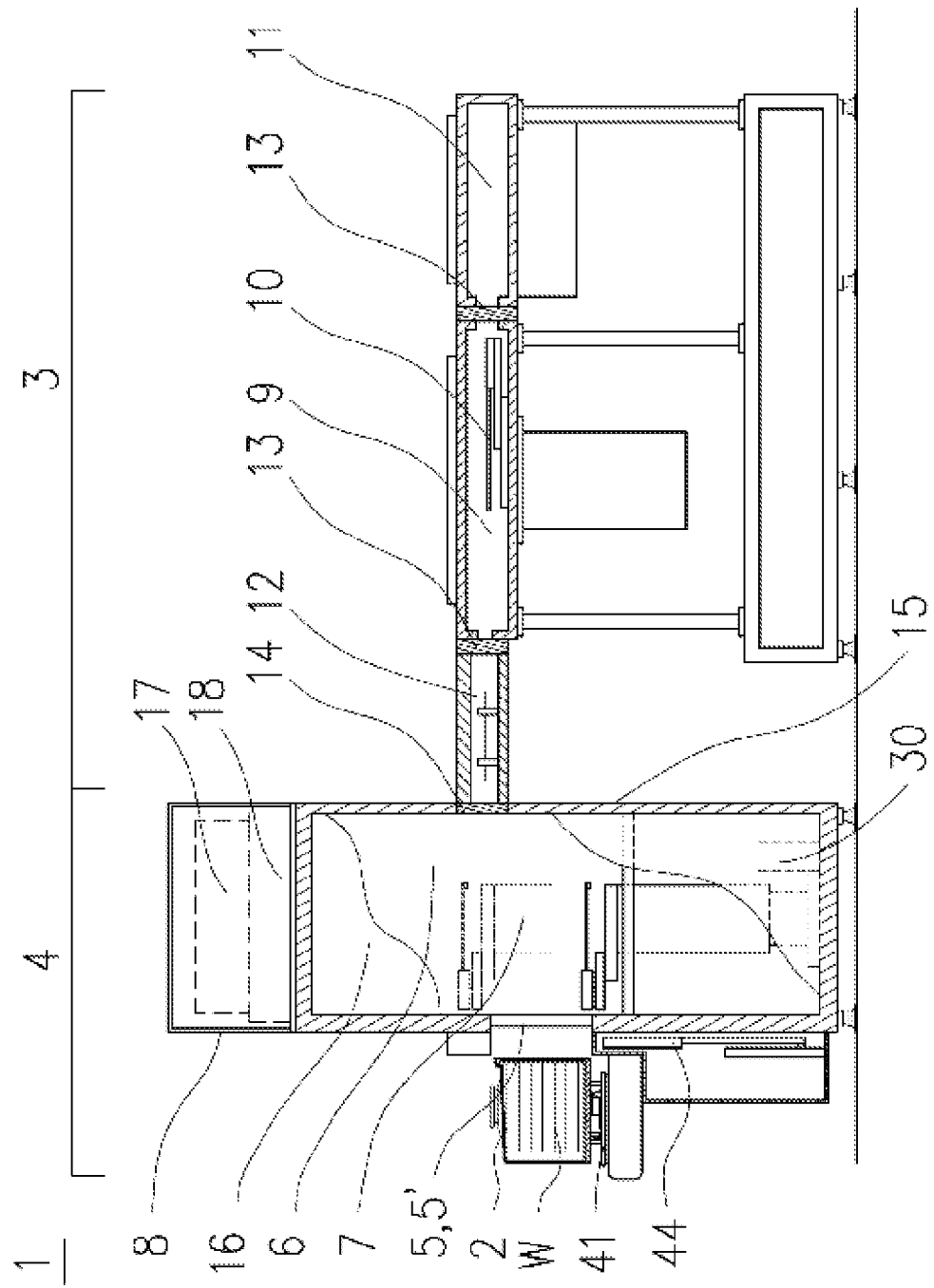
FIG. 3 is a cross-sectional view showing a processing system.
Figure 4:
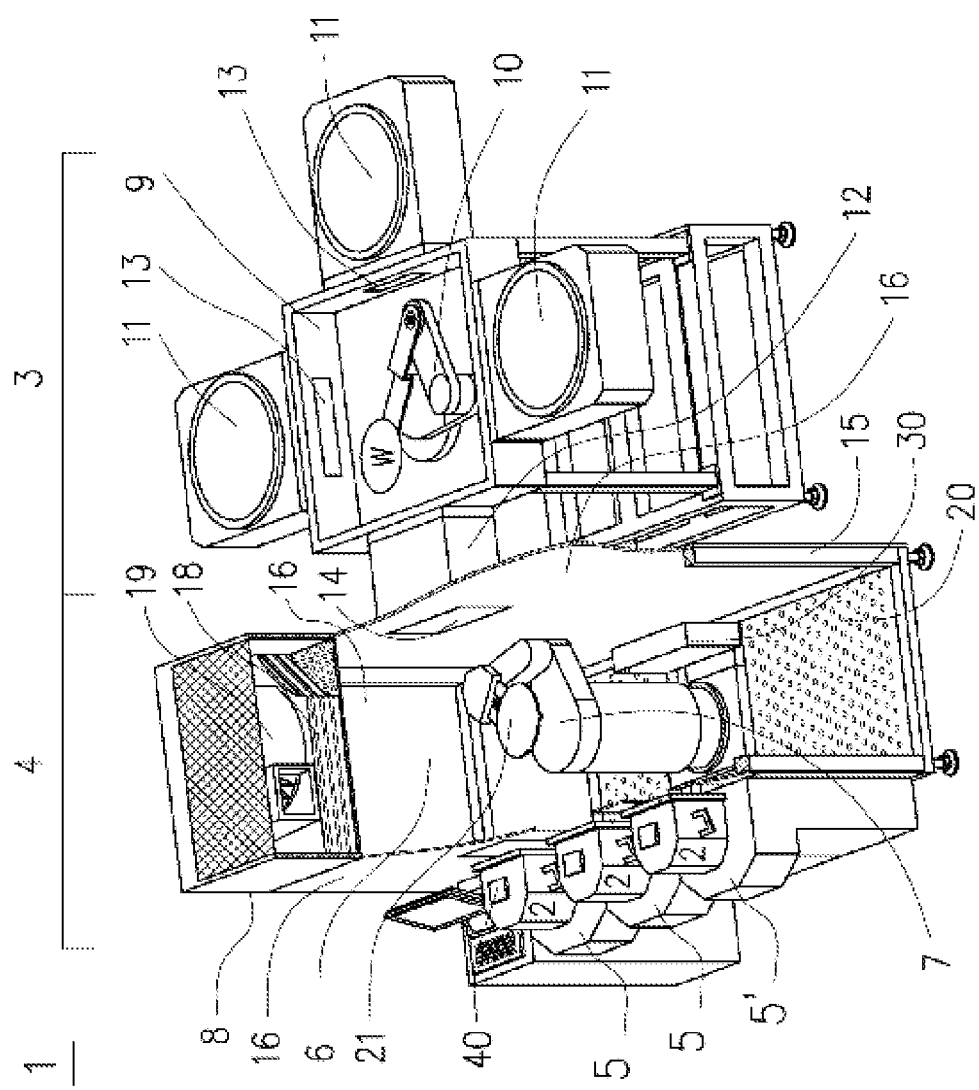
FIG. 4 is a perspective view showing the processing system.

Hereinafter, a processing system 1 of an embodiment of the present invention will be described in detail with reference to the drawings. FIG. 3 is a cross-sectional view showing a processing system 1 of an embodiment of the present invention, and FIG. 4 is a perspective view thereof. Although a processing target of the processing system 1 in the present embodiment is a semiconductor wafer W the present invention is sufficiently applicable to processing systems of other thin-plate substrates. The processing system 1 is installed in a factory called a clean room, which is controlled to a relatively clean atmosphere of about class 100 having a 0.5 micrometer dust and at a predetermined room temperature around 20° C. The processing system 1 of the present embodiment mounts an FOUP 2 transported from the previous step and opens a door thereof, and includes an EFFM 4 and a processing device 3. Here, the EFFM 4 is configured to exchange the semiconductor wafer W stored in the FOUP 2 between the processing device 3, and the processing device 3 is to perform a predetermined processing on the surface of the semiconductor wafer W. The EFEM 4 includes a load port 5, a load port 5' having a replacement function, a mini environment space 6, a transfer robot 7 for transferring the semiconductor wafer W in the mini environment space 6, and an FFU 8 for supplying a clean air downflow in the mini environment space 6. Further, the processing device 3 includes a transfer chamber 9, a vacuum transfer robot 10 which is disposed in the transfer chamber 9 and transfers the semiconductor wafer W in a vacuum atmosphere, a processing chamber 11 and a load lock chamber 12.

The processing device 3 includes a processing chamber 11 that performs predetermined processing such as diffusion processing, etching processing, and heat processing on the surface of the semiconductor wafer W in a predetermined atmosphere such as a vacuum atmosphere or an inert gas atmosphere; a load lock chamber 12 for exchanging semiconductor wafers W between the processing device 3 and the mini environment space 6; a transfer chamber 9 disposed adjacent to the processing chamber 11 and the load lock chamber 12; and a vacuum transfer robot 10 which is disposed in the transfer chamber 9 and transfers the semiconductor wafer W between the load lock chamber 12 and the processing chamber 11 or between the processing chamber 11 and another processing chamber 11. In addition, the processing chamber 11 and the transfer chamber 9, or the load lock chamber 12 and the transfer chamber 9 are respectively configured so as to be airtightly closed by a partition member called a slit valve 13. Further, the load lock chamber 12 and the mini environment space 6 are configured so as to be airtightly closed by a partition member called a gate valve 14. In addition, a vacuum pump for drawing the internal atmosphere into a vacuum state and a pipe for introducing an inert gas from the outside are connected to the processing chamber 11, the transfer chamber 9 and the load lock chamber 12. In addition, a pipe for supplying a reaction gas used to perform various surface processings is connected to the processing chamber 11.

The mini environment space 6 is a transfer space maintained in a clean atmosphere for transferring the semiconductor wafer W, and is formed by transfer space forming members of the frame 15 and the wall member 16 for separating from the external atmosphere. The FFU 8 is disposed on the ceiling of the mini environment space 6. The FFU 8 includes a fan 17 for supplying air downward toward the mini environment space 6, and a high-performance filter 18 for removing contaminants such as minute dust and organic matter present in the supplied air. In addition, the floor surface of the mini environment space 6 is provided with an opening through which the supplied clean air can flow out of the EFEM 4. According to this configuration, the clean air supplied to the mini environment space 6 through the FFU 8 flows in a downward laminar flow in the mini environment space 6 and flows out of the opening of the floor surface to the outside of the device. Further, in the EFEM 4 of the present embodiment, the air pressure inside the mini environment space 6 is maintained in the positive pressure of about 1.5 Pa more than the external atmosphere by adjusting the opening ratio of the opening with the rotation speed of the fan 17 and the plate 20 disposed on the floor, thereby preventing the ingress of contaminants and dust from the outside. According to these configurations, the dust generated from the driving mechanism such as the transfer robot 7 or the like can flow out to the outside along the downward laminar flow, thereby preventing the ingress of dust from the outside. According to this, the mini environment space 6 is always maintained in a high clean atmosphere of class 100 or more with 0.5 micrometer dust.

Figure 5A:
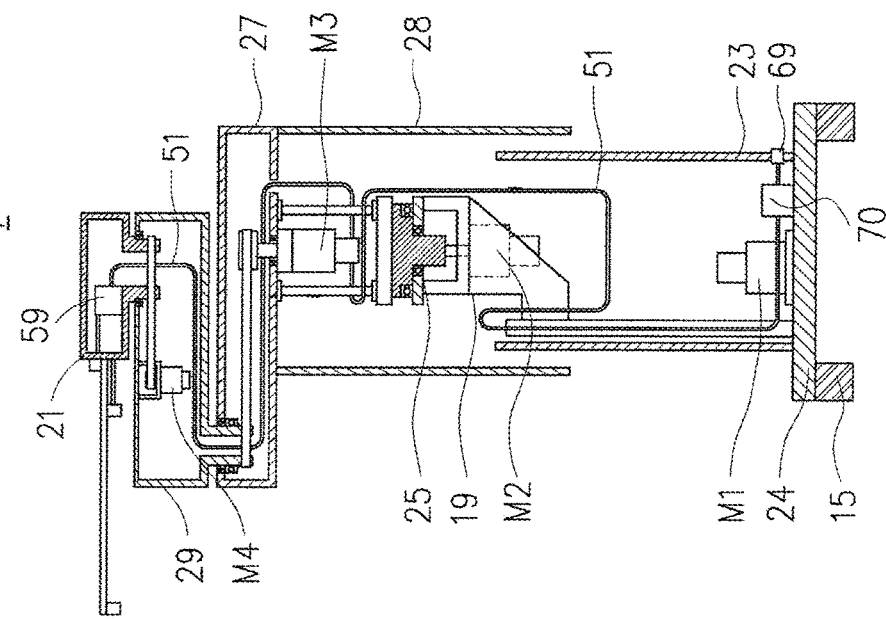
FIG. 5a and FIG. 5b are cross-sectional views showing a transfer robot 7 of one embodiment of the present invention.
Figure 5B:
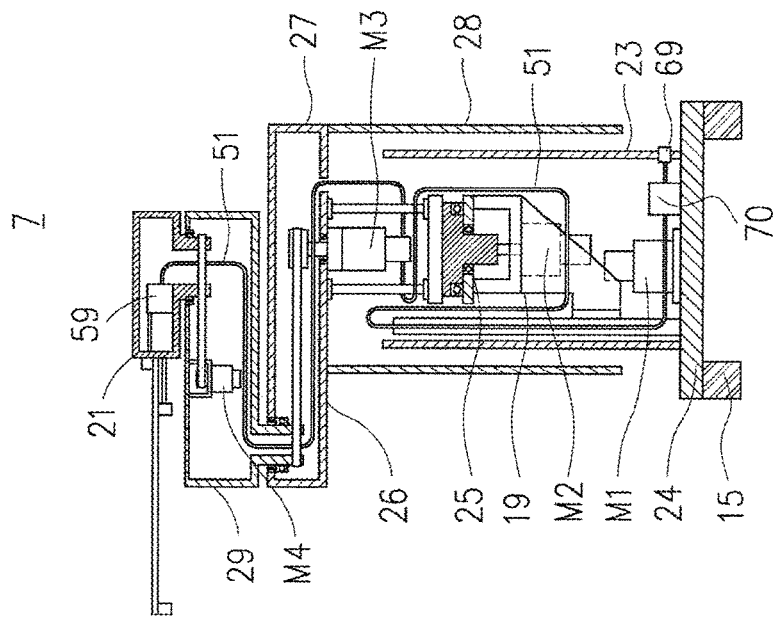

The transfer robot 7 is disposed in the mini environment space 6 and transfers the semiconductor wafer W between the FOUP 2 and the processing device 3. FIG. 5a and FIG. 5b are cross-sectional views showing an outline of an atmosphere transfer robot 7 of one embodiment of the present invention. The atmosphere transfer robot 7 of the present embodiment is a scalar robot that is a clean robot capable of preventing the scattering of dust. The atmosphere transfer robot 7 of the present embodiment includes a base 24 fixed to a frame 15 disposed on the bottom surface of the EFEM 4 and a body portion 25 capable of moving up and down and rotating with respect to the base 24. The base 24 is provided with an elevating mechanism for moving the body portion 25 up and down, and the body portion 25 is supported through a bracket 19 by a moving element provided in the elevating mechanism. The elevating mechanism includes a guide member for guiding the body portion 25 in the vertical direction, a ball screw mechanism for moving the moving element fixed to the body portion 25 up and down by rotation of a screw shaft, and a motor M1 for driving the ball screw mechanism.

The body portion 25 includes a body frame 27 integrally formed at a proximal end of the first arm 26 and a body cover 28 fixed to the body frame 27. A second arm 29 is pivotally connected to the tip of the first arm 26 through a bearing, and an arm body 22 is formed from the first arm 26 and the second arm 29. The body frame 27 is rotatably mounted on the bracket 19 through a bearing, and is rotationally moved in the horizontal plane by a motor M2 provided on the bracket 19. Thus, the first arm 26 integrated with the body frame 27 is also rotationally moved in the horizontal plane together with the body frame 27.

The proximal end of the second arm 29 is rotatably supported through a bearing at the tip end of the first arm 26 (body frame 27). In addition, the holding finger 21 according to the embodiment of the present invention is rotatably supported at the tip of the second arm 29 through a bearing. The first arm 26 (body frame 27) is a housing in the form of a box having a hollow inside, and a motor M3 for driving the second arm 29 and a transmission mechanism such as a pulley or a belt for transmitting the driving force from the motor M3 are located therein. According to this, the second arm 29 is rotationally moved in the horizontal plane by the operation of the motor M3. The second arm 29 is also a housing in the form of a box having a hollow inside, and a motor M4 for driving the holding finger 21 and a transmission mechanism such as a pulley or a belt for transmitting the driving force from the motor M4 are located therein. According to this, the holding finger 21 is rotationally moved in the horizontal plane by the operation of the motor M4. Besides, a configuration including a motor M4 for driving the holding finger 21 and a transmission mechanism such as a pulley or a belt for transmitting the driving force of the motor M4 is called a finger drive mechanism herein.

According to the above configuration, the first arm 26 and the second arm 29 interlock with each other and rotate in the opposite direction, whereby the arm 22 is bent and extended, and the holding finger 21 disposed at the tip of the arm 22 moves forward and backward. The configuration including a motor M2 for driving the first arm 26, a motor M3 for driving the second arm 29, and a transmission mechanism such as a pulley or a belt for transmitting the driving force of each motor is referred to as an arm body driving mechanism herein. In addition, the holding finger 21 is rotated in the direction opposite to the rotation direction of the second arm 29 in conjunction with the rotation of the second arm 29 by the operation of the motor M4, so that the holding finger 21 can maintain posture to face the predetermined direction. Besides, each opening portion of these housings in the form of a box is sealed by a lid, so that dust generated by the operation of the pulley or the belt does not scatter to the outside.

A base cover 23 is attached to the inside of the body cover 28 mounted on the side surface of the body 25 with a predetermined gap to cover a drive unit and electronic components disposed on the base 24. The body cover 28 is formed such that the lower end is positioned below the upper end of the base cover 23 even when the body 25 moves up to the highest position, and prevents dust generated from the motor M1 disposed on the base 24 or the transmission mechanism such as the belt or the pulley from being scattered outside the atmosphere transfer robot 7. In addition, the transfer robot 7 of the present embodiment includes a joint 69 for connecting pipes laid from an inert gas supply source (not illustrated) and a piping member 51 for supplying an inert gas from the joint 69 to the holding finger 21. Further, a filter 70 for removing dust and impurities contained in the inert gas is provided in the middle of the piping member 51.

Besides, in addition to the filter 70, a temperature control device for adjusting the temperature of the inert gas and an ionizer for discharging the inert gas can also be provided. Further, the transfer robot 7 according to the present embodiment is connected to a control unit 30 for controlling the operation of each drive unit in accordance with position data and speed data which is taught and stored in advance by transmitting and receiving signals to and from the host PC. See FIGS. 3 and 4. The control unit 30 controls, in addition to the operation control of the drive unit, so as to maintain the appropriate state by receiving the signals transmitted from the whole of electric components provided to the transfer robot 7, such as control of an electromagnetic valve 59 for switching the supply and shut-off of the inert gas and control of the temperature control device and the ionizer. Besides, the filter 70 provided in the transfer robot 7 according to the present embodiment is made of polytetrafluoroethylene (PTFE), and can filter 99% or more of the 0.01 micrometer dust contained in the inert gas. Further, the filter 70 can be disposed not only in the main body of the transfer robot 7 but also in a wrist block 56.

Figure 6A:
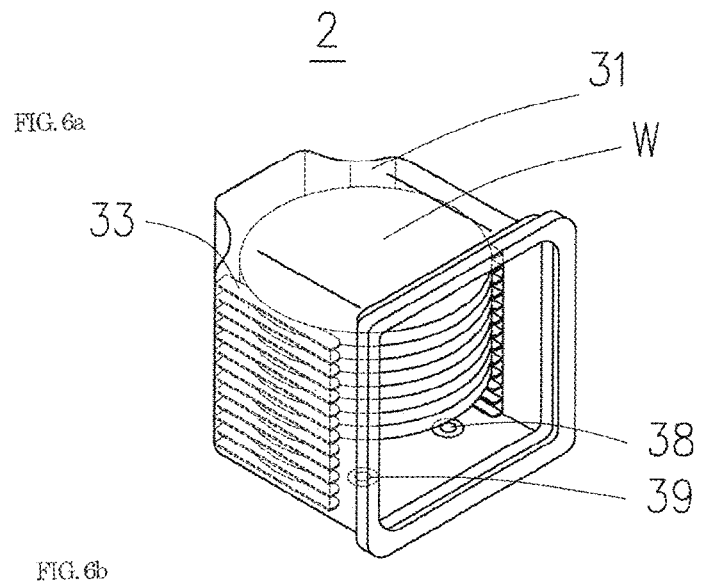
FIG. 6a, FIG. 6b and FIG. 6c are perspective views showing overview of an FOUP 2.
Figure 6B:
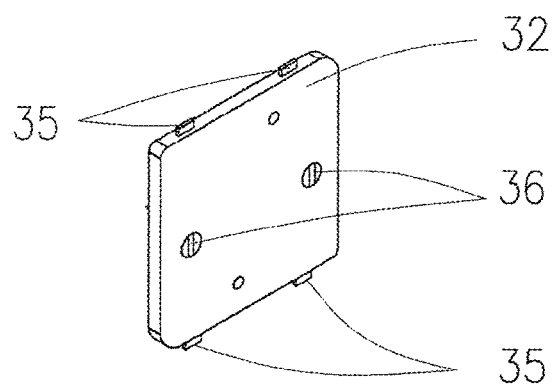
Figure 6C:
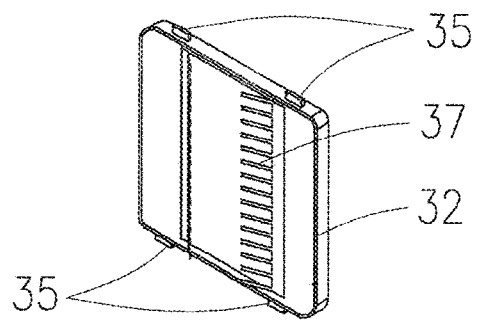

Next, FOUP 2 that is an example of a sealable container will be described with reference to FIG. 6. FIG. 6a, FIG. 6b and FIG. 6c are perspective views showing the FOUP 2 and components thereof. The FOUP 2 is a sealable container for isolating the semiconductor wafer W to be stored from a low clean external atmosphere and transferring the semiconductor wafer W between the processing systems 1 disposed in a clean room by maintaining the inside in a highly clean atmosphere. The FOUP 2 includes a carrier 31 that is a box-like container for storing the semiconductor wafer W inside, and a lid 32 for airtightly closing an open surface provided on the carrier 31. In addition, a plurality of shelf boards 33 for mounting the semiconductor wafer W in a horizontal state are provided on the inner wall of the carrier 31 at predetermined intervals in the vertical direction. The semiconductor wafer W is placed on each shelf board 33 with the surface to be processed facing upward. The lid 32 is provided with a lock mechanism, whereby an engagement or a release between the lid 32 and the carrier 31 can be achieved by appearing/disappearing and moving the lock member 35 with respect to a hole 34 for engagement formed around opening of the carrier 31. Besides, the lock mechanism is connected to a latch key 36 provided on the lid 32, and appears/disappears and moves the lock member 35 by rotating the latch key 36 clockwise or counterclockwise. Thus, by rotating the latch key 36 in a predetermined direction, the carrier 31 and the lid 32 can be switched between the locked state and the unlocked state. The rotation of the latch key 36 is performed by hand or a lid opening/closing mechanism 43 of the load port 5 described below.

A member called a retainer 37 is provided on the surface of the lid 32 facing the carrier 31 to restrict the movement of the semiconductor wafer W during transfer of the FOUP 2 by pressing the edge of the semiconductor wafer W housed in the carrier 31 horizontally. In addition, a suction port 38 for sucking the atmosphere into the FOUP 2 and a supply port 39 for supplying the inert gas into the FOUP 2 are provided on the bottom surface of the carrier 31. The suction port 38 and the supply port 39 are constructed so as to replace the atmosphere inside the FOUP 2 with the inert gas atmosphere by being respectively connected to a suction nozzle 38' and a supply nozzle 39' provided on the load port 5.

Figure 7:
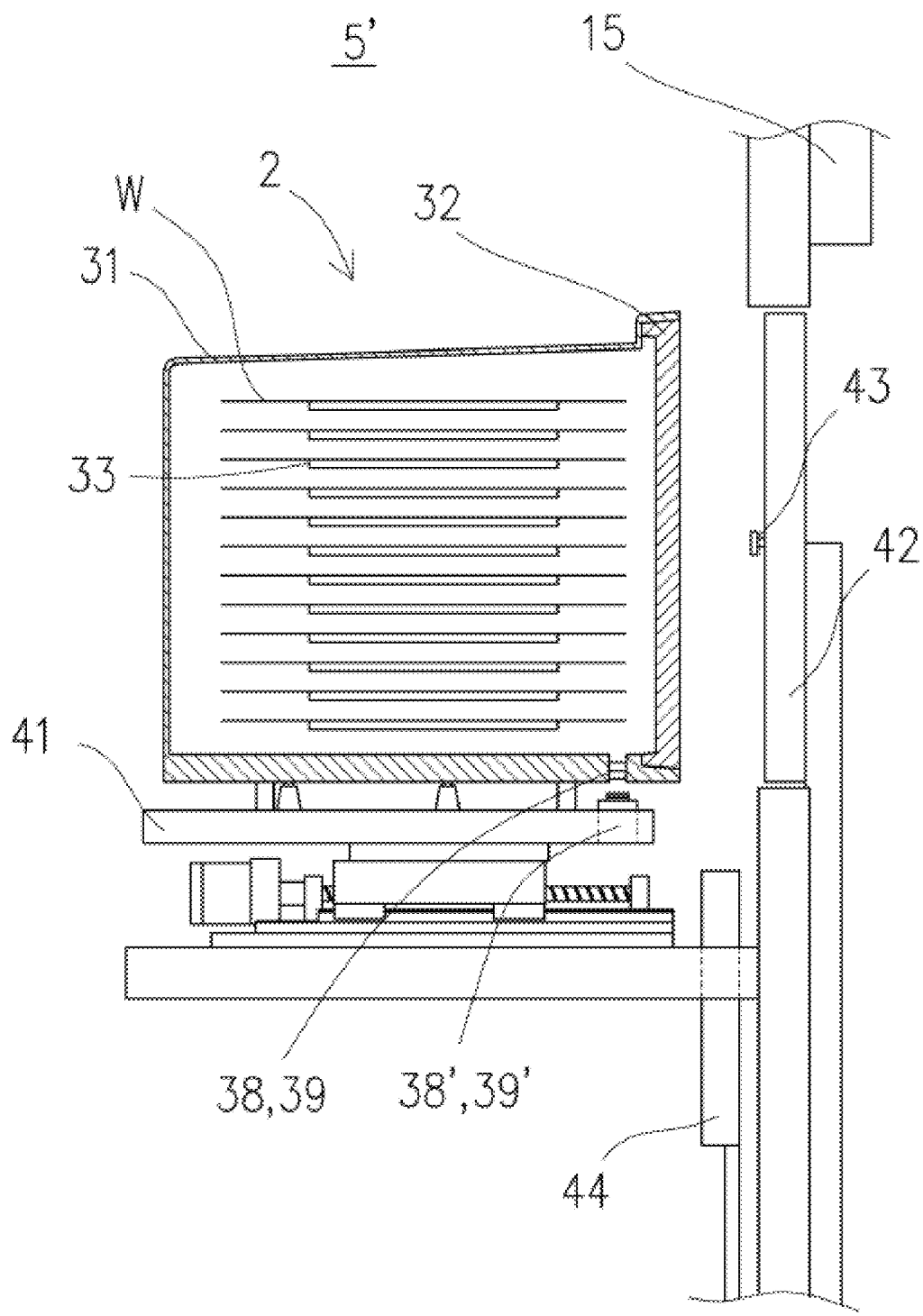
FIG. 7 is a cross-sectional view of overview of a load port 5.

Next, a known load port 5 included in the EFEM 4 of the present embodiment and a load port 5' having a replacement function will be described. FIG. 7 is a cross-sectional view showing one example of the load port 5' with replacement function. The load port 5 is a device for mounting the FOUP 2 carried from the previous step and separating the lid 32 closing the FOUP 2 from the carrier 31, which is fixed on the frame 15 forming the mini environment space 6. The load port 5 is provided with a stage 41 for mounting the FOUP 2 at a predetermined position by the positioning mechanism, an FIMS door 42 integrated with the lid 32 of the FOUP 2, and a lid opening/closing mechanism 43 provided on the lid 32 and rotating the latch key 36 provided on the FIMS door 42. Further, the stage 41 and the FIMS door 42 are provided with driving mechanisms (not illustrated) to move in a predetermined direction, respectively.

When the FOUP 2 is carried on the stage 41, the load port 5 advances the stage 41 toward the FIMS door 42 to bring the lid 32 into contact with the FIMS door 42. Next, the load port 5 operates the lid opening/closing mechanism 43 to rotate the latch key 36 provided on the lid 32 until the lock member 35 is unlocked, and then moves the stage 41 or the FIMS door 42 to separate the lid 32 and the carrier 31. Thereafter, the load port 5 lowers the FIMS door 42 integrated with the lid 32 to a position that does not interfere with the wafer access operation of the transfer robot 7, and moves forward the stage 41 on which the carrier 31 is mounted to a position that the transfer robot 7 can access to the semiconductor wafer W Besides, when the transfer of the processed semiconductor wafer W to the carrier 31 is completed, the load port 5 operates the stage 41 and the FIMS door 42 to airtightly close the opening of the carrier 31 with the lid 32.

Next, the load port 5' having a function for replacing the inside of the FOUP 2 with the inert gas atmosphere by supplying the inert gas into the FOUP 2 in addition to the function of the general load port 5 as described above will be described. The EFEM 4 of the present embodiment includes at least one load port 5' with replacement function. The load port 5' with replacement function provided in the present embodiment includes a suction nozzle 38' and a supply nozzle 39' in addition to the configuration of the general load port 5. The suction nozzle 38' is connected to a suction pump (not illustrated), and fills the internal atmosphere of the FOUP 2 with the inert gas through the suction port 38 of the FOUP 2. Further, the supply nozzle 39' is connected to an inert gas source (not illustrated), and fills the inside of the FOUP 2 with the inert gas through the supply port 39 of the FOUP 2. In addition, an elevating means for moving up and down the suction nozzle 38' and the supply nozzle 39', respectively is provided in the stage 41, and moves upward the suction nozzle 38' and the supply nozzle 39' to connect to the ports 38, 39, respectively when the atmosphere replacement is required, and moves downward the suction nozzle 38' and the supply nozzle 39' when the atmosphere replacement is unnecessary.

In addition, some load ports are provided with a purge plate 44 that moves upward to a position facing the open surface of the carrier 31 after the FOUP 2 is opened to fill the inside of the carrier 31 with the inert gas, in addition to the suction nozzle 38' and the supply nozzle 39'. The purge plate 44 is a box-like member having an ejection port at the position facing the open surface of the carrier, and is connected to an inert gas supply source (not illustrated). Further, the purge plate 44 is supported by an elevating mechanism (not illustrated), and constructed so as to supply the inert gas into the carrier 31 by moving upward when the transfer robot 7 does not access the carrier 31. In addition, the purge plate 44 is constructed so as to move downward to a position not interfering with the operation of the transfer robot 7 by stopping the supply of the inert gas when the transfer robot 7 accesses the inside of the carrier 31. Setting the internal atmosphere of the FOUP 2 containing the semiconductor wafer W after processing to the inert gas atmosphere by the load port 5' with replacement function can prevent natural oxidation of the surface to be processed of the semiconductor wafer W. Besides, as another embodiment of the load port 5' with replacement function, for example, there is one locating a nozzle for injecting an inert gas near the opening of the carrier 31. However, the load port 5' with replacement function mounted on the EFEM 4 in the present invention is not limited to the above-described embodiment, and may be in any form as long as the atmosphere inside the FOUP 2 can be replaced with an inert gas atmosphere.

Figure 8:
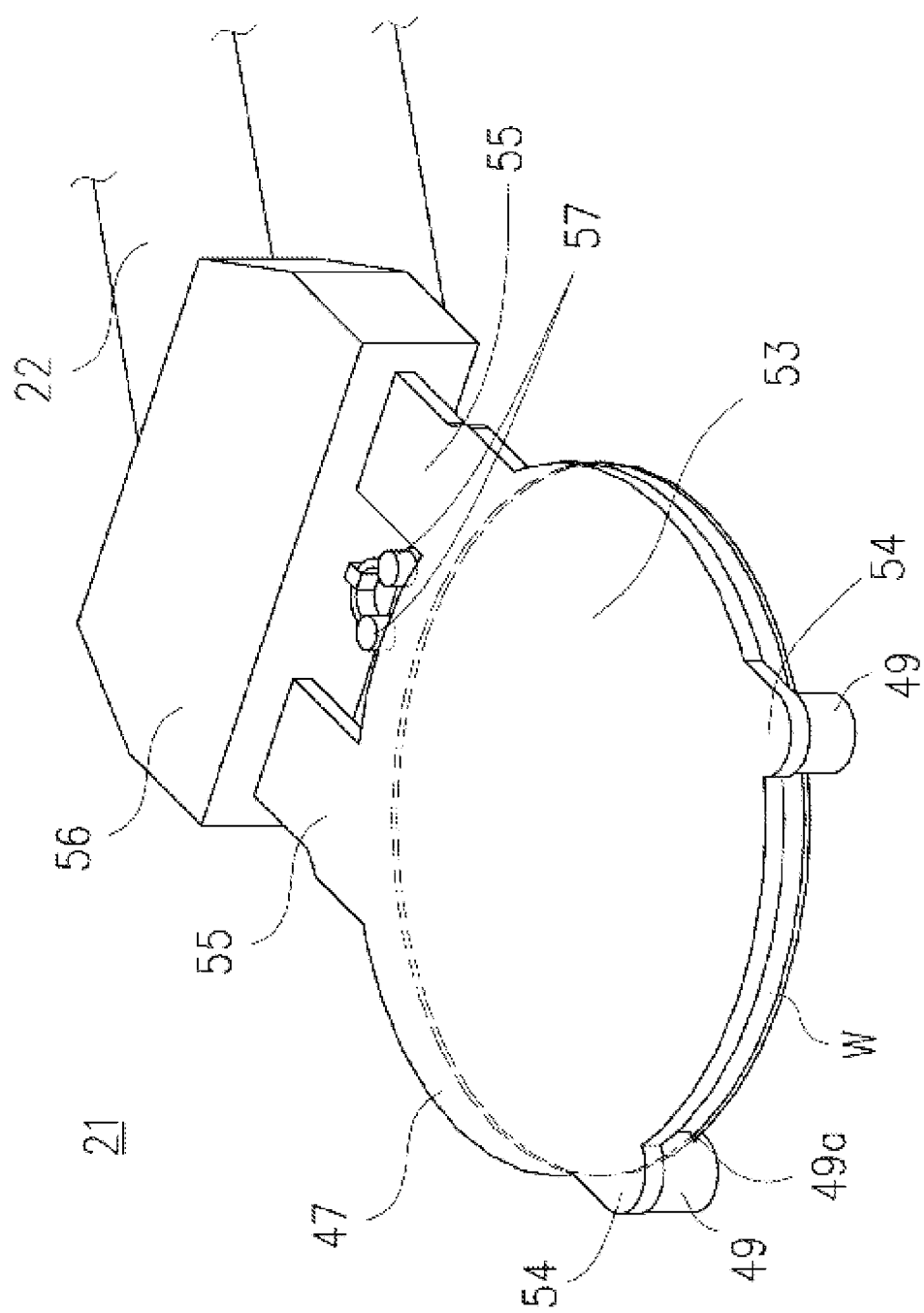
FIG. 8 is a perspective view showing a holding finger 21 of one embodiment of the present invention.
Figure 9A:
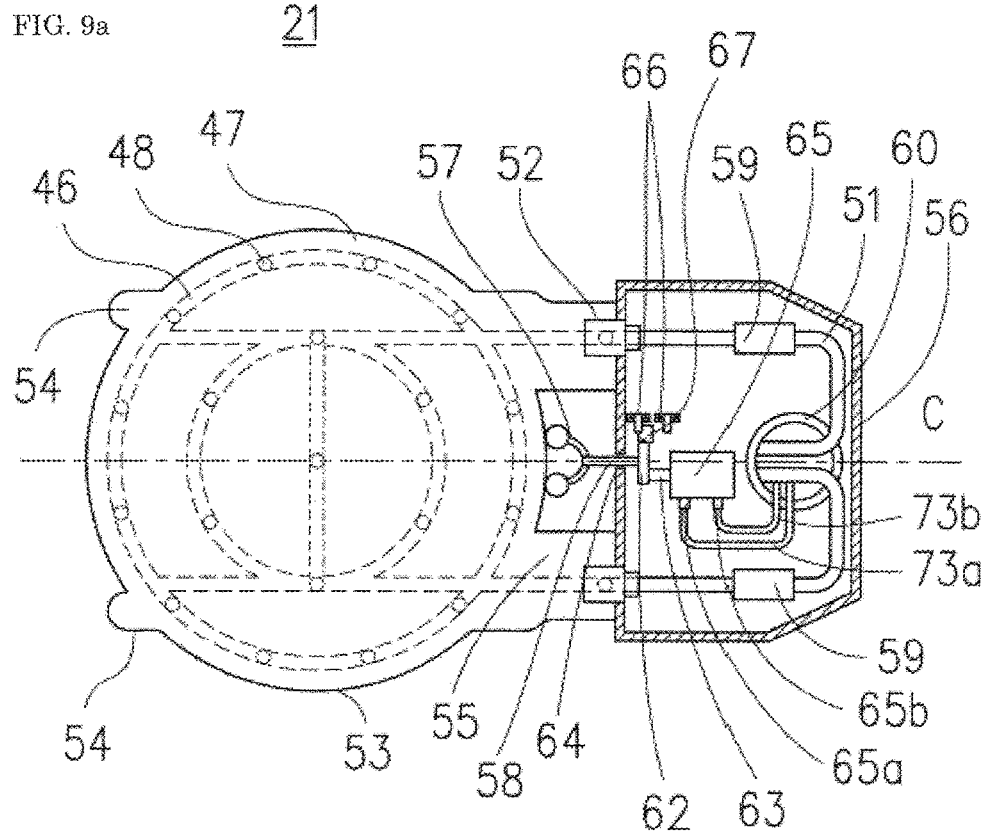
FIG. 9a and FIG. 9b are views showing the holding finger 21 of one embodiment of the present invention.
Figure 9B:
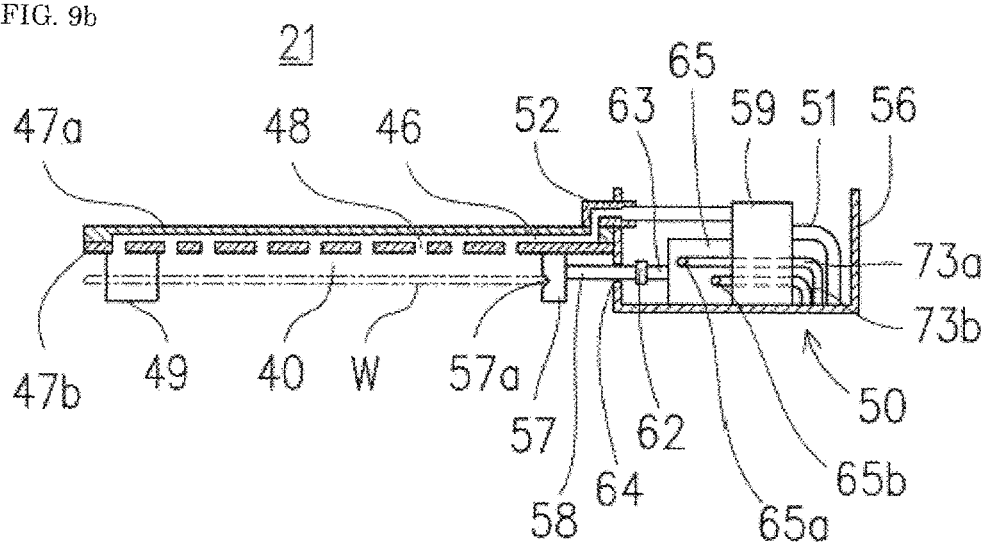

Next, the holding finger 21 which is one embodiment of the present invention will be described. FIG. 8 is a perspective view showing the holding finger 21. FIG. 9a is a top view, and FIG. 9b is a cross-sectional view. The holding finger 21 of the present embodiment ejects the inert gas toward the surface to be processed of the thin-plate substrate W while holding the thin-plate substrate W, thereby preventing a natural oxide film from being generated on the surface to be processed of the thin-plate substrate W. The inert gas ejected from the holding finger 21 fills the space 40 formed by the holding finger 21 and flows out of the space 40 together with the air remaining in the space 40. Then, by continuously supplying the inert gas, the atmosphere and the reaction gas components remaining in the space 40 all flow out to the outside of the space 40, and the inside of the space 40 is replaced with the inert gas atmosphere. In addition, the inert gas ejected into the space 40 sequentially flows out of the space 40 from the gap between the holding finger 21 and the thin-plate substrate W and the outward flow of the inert gas flowing out of the space 40 plays a role of a seal, thereby preventing air from flowing into the surface to be processed which is the upper surface of the thin-plate substrate W. According to this, the natural oxide film can be prevented from generating on the surface to be processed of the thin-plate substrate W.

The holding finger 21 of the present embodiment is used by being attached to the tip portion of the arm body 22 of the thin-plate substrate transfer robot 7. The holding finger 21 of the present embodiment includes: a finger body 47 having a flow path 46 formed inside for circulating the inert gas, an ejection port 48 for ejecting the inert gas onto the surface to be processed of the semiconductor wafer W by communicating with the flow path 46 and by being disposed on a surface of the finger body 47 facing the surface to be processed of the semiconductor wafer W, an abutting member 49 for abutting a peripheral portion of the semiconductor wafer W by being disposed on the surface on which the ejection port 48 of the finger body 47 is formed, a clamp mechanism 50 for gripping or releasing the semiconductor wafer W below the finger body 47 by moving forward and backward with respect to the semiconductor wafer W and a piping member 51 for communicating an inert gas supply source (not illustrated) and the flow path 46. Besides, although the thin-plate substrate which is the holding object of the holding finger 21 of the present embodiment is the semiconductor wafer W, the present invention is not limited to this.

The finger body 47 of the present embodiment consists of two members of an upper member 47a and a lower member 47b, the upper member 47a being formed with the flow path 46 for inert gas and the lower member 47b being formed with a plurality of through holes (ejection ports) 48 for ejecting the inert gas. The through holes (ejection port) 48 provided on the lower member 47b are disposed at positions communicating with the flow path 46 when the upper member 47a and the lower member 47b are bonded. Thus, the inert gas supplied into the flow path 46 is ejected from the through holes 48 toward the surface to be processed of the semiconductor wafer W. In addition, a joint member 52 is attached to the upper member 47a at a position communicating with the flow path 46, and the piping member 51 for circulating the inert gas is connected to the joint member 52 through an electromagnetic valve 59. Besides, although the material of the finger body 47 of the present embodiment uses anodized aluminum, the present invention is not limited to this, and for example, a material such as ceramic, carbon, engineering plastic, etc. can also be used.

Further, the finger body 47 of the present embodiment includes a disk-shaped purge part 53 having the same diameter as that of the semiconductor wafer W of the holding object, locking portions 54 formed so as to project symmetrically from the disk-shaped purge part 53, and a base 55 disposed at a position opposite to the locking portion 54 and which is fixed on the wrist block 56. The purge part 53 has a plurality of ejection ports 48 for blowing an inert gas onto the surface to be processed of the held semiconductor wafer W disposed at predetermined positions. The purge part 53 of the present embodiment is formed in almost the same diameter as that of the semiconductor wafer W that is a substrate to be held. This is intended to be able to supply an inert gas to the entire surface to be processed of the semiconductor wafer W while blocking the downflow from the FFU 8, and to prevent collision with the wall surface of the FOUP 2 when inserting into the FOUP 2. Besides, the holding finger 21 of the present invention is not limited to the above-described shape, and may be formed smaller or larger than the diameter of the substrate to be held as long as it does not collide with the FOUP 2. In addition, the holding finger 21 may be formed in not only a disk-shape but also polygons such as a square, a rectangle, and a hexagon.

Figure 11:
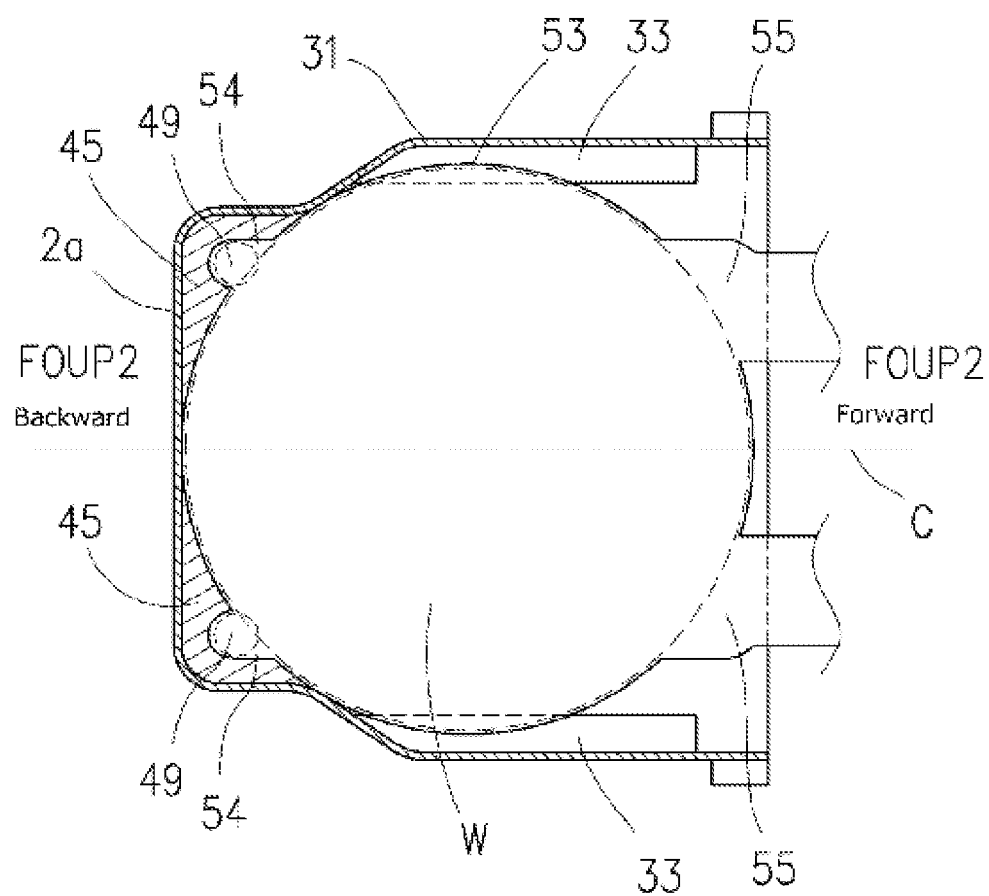
FIG. 11 is a view showing an access position in the FOUP of the holding finger 21 of one embodiment of the present invention.

The locking portions 54 are formed at the tips of the finger body 47, and have abutting members 49 which abut the peripheral edge of the semiconductor wafer W fixed, respectively Besides, the locking portions 54 of the present embodiment are disposed so as to be symmetrical with respect to a center line C extending in the horizontal plane of the finger body 47 in a top view. In addition, the abutting members 49 fixed to the locking portions 54 in the present embodiment are fixed on the same surface as the surface of the finger body 47 on which the semiconductor wafer W is held, that is, the surface of the purge part 53 on which the ejection ports 48 are formed. Each abutting member 49 of the present embodiment is formed in almost a cylindrical shape, and a V-shaped notch 49a is formed in a portion abutting on the semiconductor wafer W so as to engage with the peripheral edge of the semiconductor wafer W Further, the locking portions 54 and the abutting members 49 are disposed so as to be smaller than the separation dimension in the horizontal plane of the pair of left and right shelf boards 33 formed in the FOUP 2 in order to hold and transfer the substrate to be held which is contained in the FOUP 2. Besides, in the known FOUP 2, when the semiconductor wafer W is mounted on a predetermined position of the inside, a space 45 for storing the semiconductor wafer W is provided between the semiconductor wafer W and the wall surface 2a at the rear of the FOUP 2. The locking portions 54 and the abutting members 49 in the present embodiment move to the space 45 when transferring the semiconductor wafer W to the FOUP 2. See FIG. 11.

With the above configuration, the finger body 47 can transfer the semiconductor wafer W mounted on the shelf board 33 outside the FOUP 2 without contacting the FOUP 2 or the like, and mount the held semiconductor wafer W on a predetermined shelf board 33 inside the FOUP 2. The details of the operation of the finger body 47 accessing the semiconductor wafer W housed inside the FOUP 2 will be described later. Besides, since the abutting member 49 is a member that abuts the peripheral edge of the semiconductor wafer W it is preferable to use a hard synthetic resin material having high wear resistance such as wear resistant polyester, ultra-high molecular weight polyethylene and PEEK (polyether ether ketone) material which generate little dust when abutting. The base 55 is an end portion of the finger body 47, and is fixed to the wrist block 56 by a known technique such as a screw or an adhesive. In addition, a joint member 52 for connecting the flow path 46 formed in the finger body 47 and the piping member 51 installed in the wrist block 56 is attached on the base 55. Further, a clamp member 57 for holding and releasing the semiconductor wafer W by moving forward and backward with respect to the semiconductor wafer W is disposed on the base 55.

In addition, the height dimension of the finger body 47 in the present embodiment is configured to be smaller than the pitch in the vertical direction of the shelf boards 33 disposed inside the FOUP 2. Besides, the pitch in the vertical direction of the shelf boards 33 of the FOUP 2 is defined by the SEMI (Semiconductor Equipment and Materials International) standard, which is an international standard for semiconductor manufacturing equipment and material fields, and it is 10 mm in case of a FOUP 2 for storing a semiconductor wafer W having a diameter of 300 mm. In subtracting the thickness of about 1 mm of the shelf board 33 similarly specified by SEMI and the thickness of about 0.8 mm of the semiconductor wafer W from 10 mm, the vertical dimension through which the finger body 47 of the present embodiment can pass is assumed to be about 8 mm. Based on this, the maximum thickness dimension of the finger body 47 of the present embodiment is a total of 7.5 mm of the finger body 47 having a thickness of 3 mm and the abutting portion having a height of 4.5 mm, and therefore, the finger body 47 can pass through the gap of the semiconductor wafers W stored on the shelf boards 33.

Each clamp member 57 is a part of the clamp mechanism 50 disposed in the wrist block 56, and is moved forward and backward with respect to the semiconductor wafer W by the operation of the clamp mechanism 50. The clamp members 57 of the present embodiment are respectively attached to bifurcated ends of a push rod 58 provided in the clamp mechanism 50, and respectively have a substantially cylindrical shape. In addition, a V-shaped notch 57a is formed on a portion of the clamp member 57 which abuts the semiconductor wafer W so as to engage with the peripheral edge of the semiconductor wafer W. Besides, since each clamp member 57 is a member that abuts the peripheral edge of the semiconductor wafer W in the same manner as the abutting member 49, it is preferable to use a hard synthetic resin material having high wear resistance such as wear resistant polyester, ultra-high molecular weight polyethylene and PEEK (polyether ether ketone) material which generate little dust when abutting.

Next, the wrist block 56 of the present embodiment will be described. The wrist block 56 is a member for supporting the finger body 47, and the finger body 47 of the present embodiment is fixed to the wrist block 56 by a screw. The wrist block 56 of the present embodiment is a box-shaped member made of aluminum, and the base end portion thereof is connected to the tip of the arm body 22 of the transfer robot 7. Inside the wrist block 56, the electromagnetic valve 59 for controlling supply and closing of the inert gas to the finger body 47, the clamp mechanism 50 for moving forward and backward the clamp member 57, and a fixing member 60 for fixing the wrist block 56 with respect to a pulley that is disposed at the tip of the arm body 22 are provided. The electromagnetic valve 59 included in the present embodiment is a known electromagnetic valve, is attached to the middle of the piping member 51 for supplying the inert gas, and blocks or opens the flow path of the inert gas formed inside the electromagnetic valve 59 in accordance with the electric signals transmitted from the control unit 30 provided in the transfer robot 7. Besides, although the transfer robot 7 of the present embodiment is provided with the electromagnetic valve 59 in the wrist block 56, the present invention is not limited to this, the electromagnetic valve 59 may be provided in the main body of the transfer robot 7 or in the arm body 22.

The clamp mechanism 50 of the present embodiment includes an air cylinder 65 for reciprocating a piston rod 63 by supplying compressed air to the supply ports 65a and 65b, a moving member 62 movable by the operation of the air cylinder 65, and a push rod 58 whose base end portion is fixed to a moving member 62 and whose tip has the clamp member 57 base end. The moving member 62 included in the present embodiment is a member for connecting the piston rod 63 and the push rod 58, and has a substantially rectangular parallelepiped shape made of aluminum. In addition, one end of the moving member 62 is fixed to the tip end of the piston rod 63, and the other end is fixed to the base end of the push rod 58. Further, the air cylinder 65 provided in the present embodiment is disposed parallel to the center line C, and the push rod 58 is disposed parallel to the center line C and so as to pass through a hole 64 formed on the wrist block 56. According to the above configuration, the compressed air is supplied to the air cylinder 65, whereby the piston rod 63 reciprocates in parallel to the center line C, and the push rod 58 connected to the piston rod 63 by the moving member 62 also reciprocates in parallel to the center line C. In addition, the clamp member 57 provided at the tip of the push rod 58 moves forward and backward with respect to the semiconductor wafer W.

The supply ports 65a and 65b of the air cylinder 65 are connected to the ends of pipes 73a and 73b for supplying compressed air. The base ends of the pipes 73a and 73b are connected to electromagnetic valves (not illustrated) provided in the body 25 of the transfer robot 7, respectively. The electromagnetic valves are electrically connected to the control unit 30, and supply or block the compressed air supplied from the supply source to the air cylinder 65 according to a command from the control unit 30.

With the above configuration, when the supply of compressed air to one supply port 65a is started by the operation of one of the electromagnetic valves according to the command of the control unit 30, the air cylinder 65 is operated to advance the piston rod 63 toward the semiconductor wafer W The forward movement of the piston rod 63 is transmitted to the clamp member 57 through the moving member 62 and the push rod 58, and the clamp member 57 clamps the semiconductor wafer W In addition, when the control unit 30 operates the other electromagnetic valve, compressed air is supplied to the other supply port 65 b, and the air cylinder 65 retreats the piston rod 63 with respect to the semiconductor wafer W Thereby the clamping operation of the clamp member 57 is released.

Furthermore, the wrist block 56 of the present embodiment is provided with two transmitted light sensors 66 for detecting the clamping operation of the clamp mechanism 50. A sensor dog 67 fixed to the moving member 62 shields one of the optical axes of the transmitted light sensor 66, whereby the control unit 30 can detect whether the clamp mechanism 50 is in the position to grip the semiconductor wafer W or in the position to release the grip. In addition, in place of the clamp mechanism 50 provided with the air cylinder 65 of the present embodiment, energizing members such as a well-known motor and a spring can be used as a drive source.

Next, an operation in which the transfer robot 7 including the holding finger 21 of the present embodiment transfers the processed semiconductor wafer W' from the processing device 3 to the FOUP 2 will be described. Besides, the operating positions of the transfer robot 7 and the vacuum transfer robot 10 are taught in advance by the operator. The semiconductor wafer W' which has been processed in the processing device 3 is transferred to the load lock chamber 12 by the vacuum transfer robot 10. When the processed semiconductor wafer W' is transferred, the load lock chamber 12 is filled with an inert gas to be changed from the vacuum state to a pressure state substantially equal to the atmospheric pressure, and then made in a state that the transfer robot 7 can access the semiconductor wafer W' by opening the gate valve 14. Thereafter, the atmosphere transfer robot 7 operates each drive mechanism to move the holding finger 21 to an upper position of the semiconductor wafer W' disposed in the load lock chamber 12. Next, the atmosphere transfer robot 7 operates the elevating mechanism to move the holding finger 21 downward to a position where the semiconductor wafer W' can be held. When the holding finger 21 is moved downward to a position where the semiconductor wafer W' can be held, the transfer robot 7 operates the clamp mechanism 50 to hold the semiconductor wafer W' by the abutting member 49 and the clamp member 57.

When a transmitted light sensor 66 detects that the semiconductor wafer W' is normally held, the transfer robot 7 operates the electromagnetic valve 59 to eject the inert gas from the purge part 53 of the holding finger 21 toward the surface to be processed of the semiconductor wafer W'. Next, the transfer robot 7 operates each drive mechanism to transfer the semiconductor wafer W in the mini environment space 6 to a position facing a predetermined empty slot of the FOUP 2 placed on the load port 5. Besides, while the semiconductor wafer W is transferred, the holding finger 21 continues to eject the inert gas toward the semiconductor wafer W Besides, although the downflow of clean air is supplied from the FFU arranged at the upper part into the mini environment space 6, this clean downflow cannot reach the processing surface of the semiconductor wafer W because of the flow of the inert gas ejected from the purge part 53. Thereby the natural oxide film becomes never generated on the surface to be processed of the semiconductor wafer W.

Figure 10A:
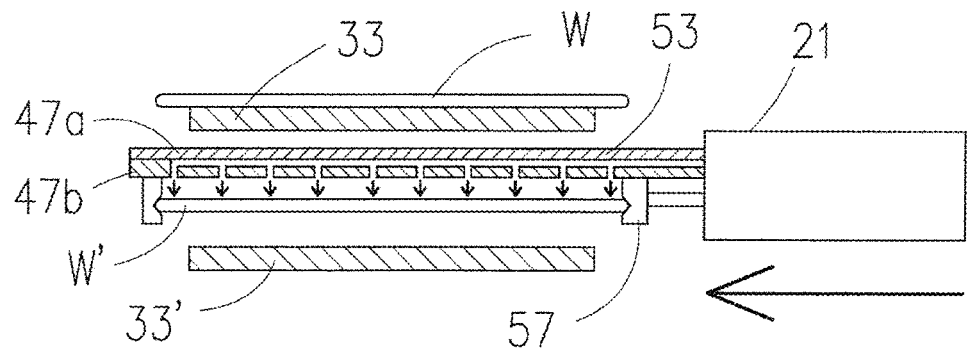
FIG. 10a, FIG. 10b and FIG. 10c are views showing a motion of the holding finger 21 of one embodiment of the present invention.
Figure 10B:
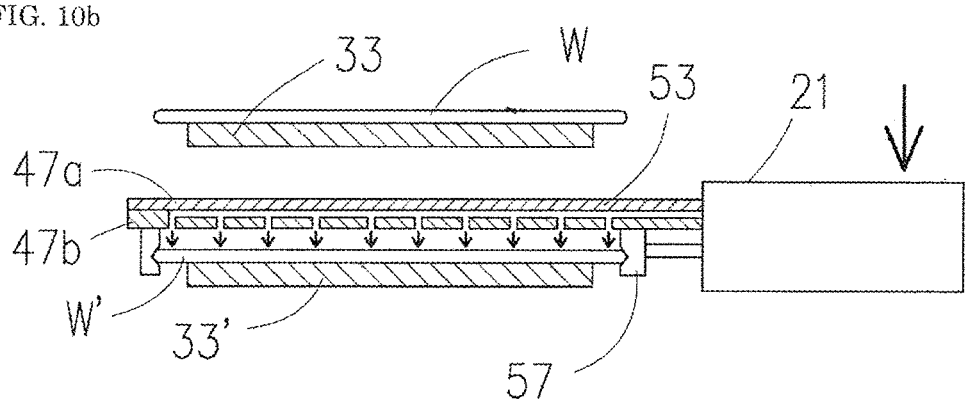

Next, the transfer robot 7 extends the arm body 22 to move the holding finger 21 at a position taught in advance above the target shelf board 33'. See FIG. 10a. When the holding finger 21 is moved forward to the upper surface of the target shelf board 33', the transfer robot 7 operates the lifting mechanism to move the holding finger 21 downward until the bottom surface of the held semiconductor wafer W' is in contact with the upper surface of the target shelf board 33'. See FIG. 10b. When the downward movement of the holding finger 21 is completed, the transfer robot 7 operates the electromagnetic valve 59 to retreat the clamp member 57, that is, to move the clamp member 57 in a direction to release the gripping of the semiconductor wafer W'.

Figure 10C:
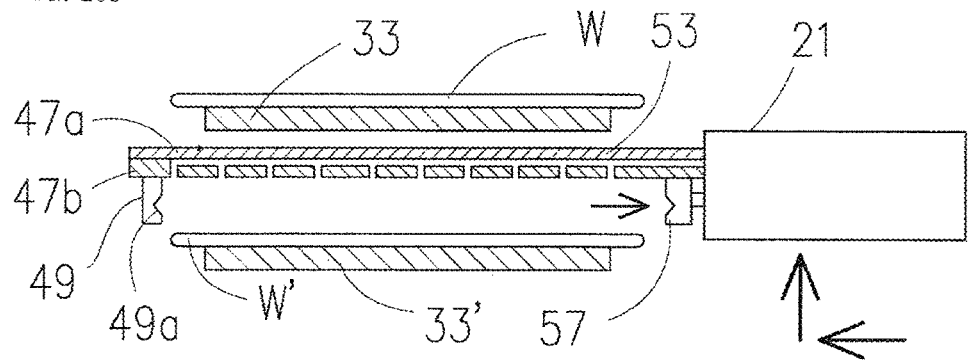

Next, the transfer robot 7 operates the arm body 22 to move the holding finger 21 slightly forward in order to avoid contact between the V-shaped notch 49a of the rising abutting member 49 and the peripheral edge of the mounted semiconductor wafer W'. Thereafter, the transfer robot 7 operates the elevating mechanism to move the holding finger 21 upward to a position not in contact with the mounted semiconductor wafer W'. See FIG. 10c. Then, the transfer robot 7 operates each drive mechanism to shift to the next transfer operation, or to move the holding finger 21 to a predetermined standby position. The above is an operation that the transfer robot 7 having the holding finger 21 of the present embodiment transfers the semiconductor wafer W' from the processing device 3 to the FOUP 2. Besides, in addition to the above operation, the transfer robot 7 having the holding finger 21 of the present embodiment can sufficiently transfer the semiconductor wafer W from the FOUP 2 to the processing device 3.

As described above, while transferring the semiconductor wafer W', the inert gas is always ejected from the holding finger 21 toward the surface to be processed of the semiconductor wafer W', so the surface to be processed of the semiconductor wafer W' is not exposed to the atmosphere and the natural oxide film is never generated. In particular, if the size of the purge part 53 of the holding finger 21 is the same as or larger than that of the substrate to be transferred, the possibility of the substrate to be transferred being exposed to the atmosphere can be further reduced. Further, in the present embodiment, the inert gas is ejected after holding the processed semiconductor wafer W' by the holding finger 21. However, the present invention is not limited to this, and it is also possible to eject the inert gas at the time when the holding finger 21 moves above the processed semiconductor wafer W'. In addition, if the internal space of FOUP 2 which is a transfer destination is previously replaced with the inert gas atmosphere through the load port with replacement function 5', the substrate to be transferred can prevent from being exposed to the atmosphere inside FOUP 2.

Further, when the substrate to be transferred is held by the conventional holding finger, the substrate to be transferred is bent by vibration during transferring, and the substrate to be transferred and the holding finger 21 come into contact, thereby causing a trouble such as damage of the surface of the substrate to be transferred. However, since the holding finger 21 of the present invention energizes the substrate to be transferred in a direction away from the holding finger, a trouble such as damage of the surface of the substrate by contacts can be reduced. In addition, since the layer of the inert gas to be ejected plays a role as a buffer material, the gap between the substrate to be transferred and the holding finger 21 can be made smaller than that of the conventional holding finger, so that the dimension of the vertical direction can be reduced than that of the conventional holding finger.

Further, the flow rate of the inert gas supplied to the holding finger 21 of the present invention needs to be a flow rate capable of replacing the surface of the semiconductor wafer W with the atmosphere. However, when the supply flow rate of the inert gas is too high, when the holding finger 21 enters into the FOUP 2, the dust remaining in the inside of the FOUP 2 is rolled up by the flow of the inert gas, thereby causing a trouble such as an adhesion of the rolled up dust to the semiconductor wafer W. Therefore, in the holding finger 21 of the present invention, it is desirable that the flow rate of the inert gas is set to about 10 to 20 liters per minute. Besides, the flow rate is adjusted by a flow control valve (not illustrated) provided in the wrist block 56. Furthermore, a pressure accumulator for the inert gas may be provided in order to cope with the trouble that the supply of the inert gas from the supply source is stopped during transferring operation. Besides, the pressure accumulator is for emergency response, and it is sufficient that the pressure accumulator have a capacity capable of supplying an inert gas until the transfer robot 7 finishes transferring the semiconductor wafer W to a predetermined position.

Figure 12A:
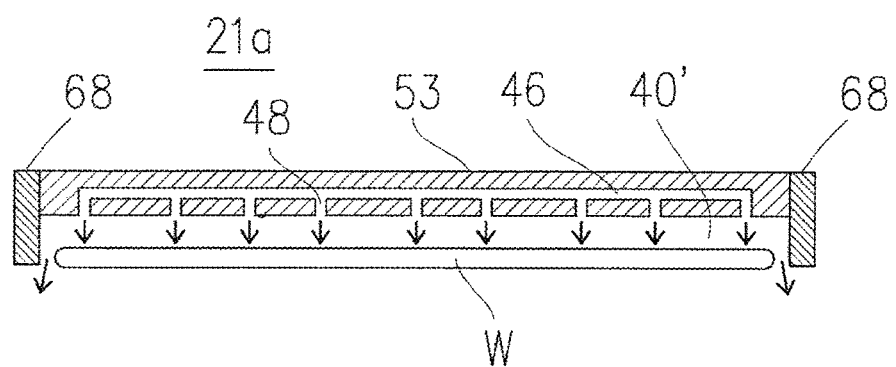
FIG. 12a and FIG. 12b are cross-sectional views showing holding fingers 21a, 21b, respectively of the other embodiment of the present invention.

As described above, in the holding finger 21 according to the first embodiment of the present invention, the ejection port 48 for ejecting the inert gas is provided in a flat plate type purge part 53. In addition to this, it is also possible to flow out the inert gas below the holding substrate by providing a shield member 68 for preventing the outflow of the inert gas in the lateral direction around the flat plate type purge part 53. FIG. 12a is a cross-sectional view showing the holding finger 21a of the second embodiment. The substrate to be held of the holding finger 21a of the present embodiment is the semiconductor wafer W, and the purge part 53 for ejecting the inert gas to the surface to be processed of the semiconductor wafer W has a substantially disk shape in a top view. A space 40' formed between the purge part 53 and the semiconductor wafer W is kept in a positive pressure higher than the space 40 of the first embodiment by mounting a substantially cylindrical shield member 68 on the disk-shaped purge part 53. Further, the ejected inert gas flows out through the gap between the semiconductor wafer W and the shield member 68 to the outside, and the inert gas flowing out to the outside serves as a fluid seal, thereby preventing the atmosphere from the outside from reaching the surface to be processed of the semiconductor wafer W. Besides, it is desirable that the lower end of the shield member 68 of the present embodiment should be configured to be above the lower surface of the held semiconductor wafer W. This is to prevent the shield member 68 from being contact with the member supporting the semiconductor wafer W, such as the shelf board 33, when the semiconductor wafer W is taken up and placed. In addition, in the case where the shield member 68 is provided around the purge part 53, in order to prevent contact between the semiconductor wafer W and the shield member 68 when the semiconductor wafer W is taken up and placed, it is desirable that the dimensions of the purge part 53 and the shield member 68 in the horizontal plane are made larger than that of the semiconductor wafer W to be held.

Figure 12B:
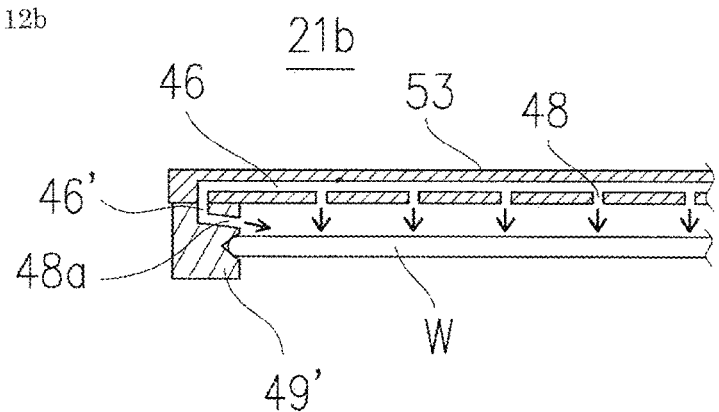

Further, as another embodiment, it may be configured so that the inert gas should be ejected from the abutting member 49 by providing a flow path 46' and the ejection port 48a to the abutting member 49 in addition to the purge part 53. The inert gas can be ejected not only in the downward air flow but also in the horizontal air flow by being also ejected from the abutting member 49', thereby effectively removing the reaction gas remaining in the corners of a pattern that is difficult to remove by the downward air flow. See FIG. 12b.

Figure 13A:
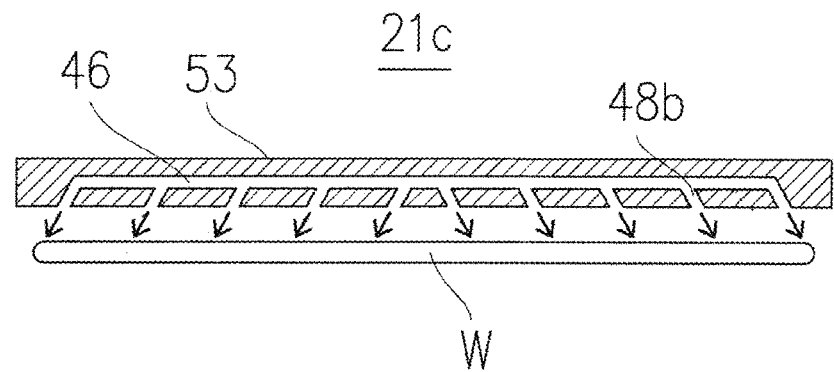
FIG. 13a and FIG. 13b are cross-sectional views showing holding fingers 21c, 21d, respectively of the other embodiment of the present invention.

In addition, as another embodiment, as disclosed in FIG. 13a, the ejection port 48b provided in the purge part 53 may be inclined toward the outside of the substrate to be held. In this case, since the inert gas is ejected toward the outside of the substrate to be held, the ejected inert gas smoothly flows to the outside compared to that ejected in the vertical direction. According to this, the reactive gas remaining on the surface of the substrate to be held can be put on the flow of the inert gas and quickly discharged. Further, since the outward flow of the inert gas is formed, the outside atmosphere can be effectively prevented from reaching the surface of the substrate to be held.

Figure 13B:
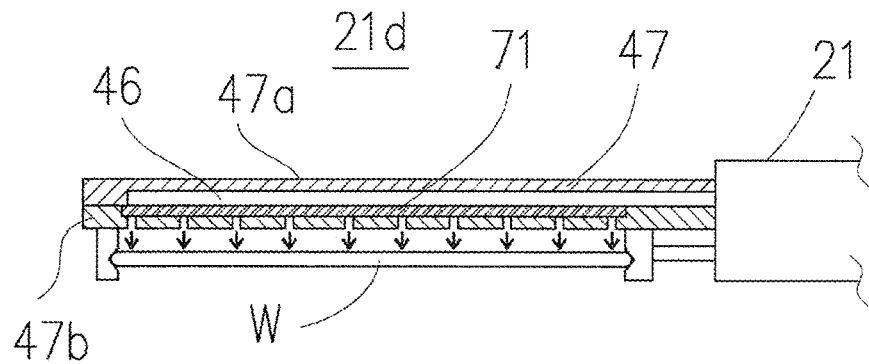

Further, as another embodiment, it may be configured so that a sheet-like filter for removing dust of inert gas may be sandwiched and fixed between the upper member 47a and the lower member 47b of the finger body 47. According to the above configuration, the dust contained in the inert gas can be removed immediately before being ejected toward the semiconductor wafer W. In particular, by providing a sheet-like filter 71 to the finger body 47, dust generated in the flow path 46, the piping member 51 disposed in the supply path for inert gas and the inside of the electromagnetic valve 59 can be prevented from adhering on the semiconductor wafer W. See FIG. 13b. Besides, the sheet-like filter 71 is made of polytetrafluoroethylene (PTFE) as with the filter 70, and preferably filters 99% or more of the 0.01 micrometer dust contained in the inert gas.

Furthermore, as another embodiment, the ejection port 48 of the finger body 47 may be provided with a nozzle using the Bernoulli Effect to make a Bernoulli chuck. The Bernoulli chuck utilizes Bernoulli's theorem (principle) that the static pressure on the flow line decreases as the velocity of the fluid (in this case, inert gas or air) increases. In the present embodiment, the static pressure between the semiconductor wafer W and the finger body 47 is reduced by adjusting the flow rate of the inert gas supplied between the semiconductor wafer W and the finger body 47, thereby attracting the semiconductor wafer W to the finger body 47 by a negative pressure which is a difference from the atmospheric pressure. By using a Bernoulli chuck for the finger body 47 of the present embodiment, the holding finger 21 can hold the semiconductor wafer W in the noncontact state as performing the atmosphere replacement of the space 40 by ejecting the inert gas to the surface of the semiconductor wafer W.

The holding finger 21 of the present embodiment is not only provided with a known nozzle, which utilizes the Bernoulli effect, at a position corresponding to the flow path 46 of the finger body 47, but the clamp mechanism 50 for holding the semiconductor wafer W and the abutting member 49 in addition to the Bernoulli chuck. According to the above configuration, the holding finger 21 can perform the following operation. First, the holding finger 21 holds the semiconductor wafer W with the clamp mechanism 50 and the abutting member 49, and ejects the inert gas from the known nozzle at a flow rate for performing atmosphere replacement. Then, the holding finger 21 ejects an inert gas from the ejection port at a flow rate sufficient to exhibit the Bernoulli Effect when mounting the semiconductor wafer W at a predetermined position. Next, the holding finger 21 operates the clamp mechanism 50 to release the mechanical holding of the semiconductor wafer W and the semiconductor wafer W is held only by the Bernoulli chuck. Thereafter, the semiconductor wafer W is mounted at a predetermined position by the operation of the transfer robot 7. With the above operation procedure, when the transfer robot 7 mounts the semiconductor wafer W an operation to avoid the contact between the semiconductor wafer W and the abutting member 49 is not required.

Figure 14A:
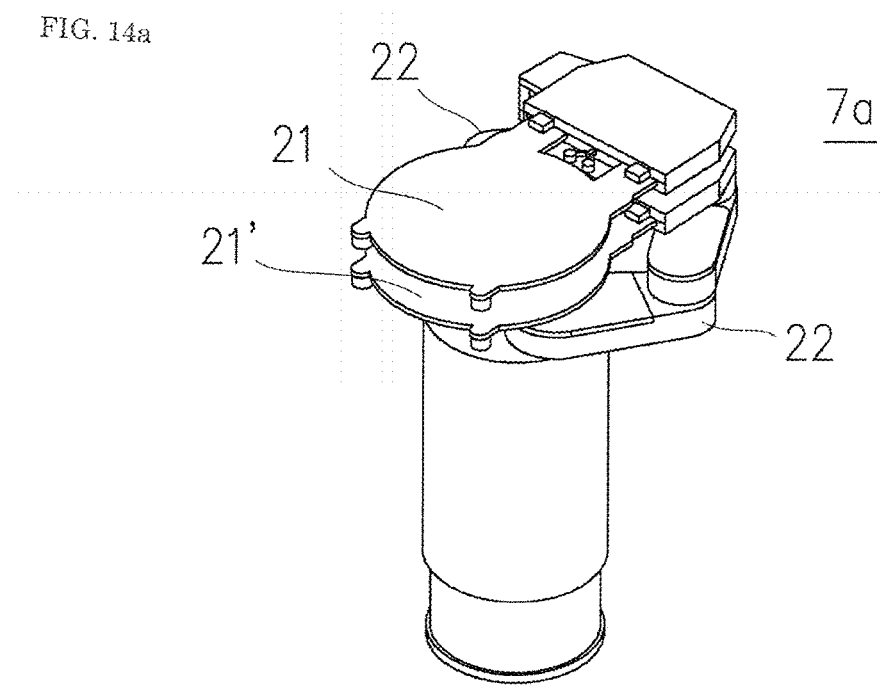
FIG. 14a and FIG. 14b are perspective views showing transfer robots 7a, 7b, respectively of the other embodiment of the present invention.

The holding fingers 21 of the present invention can be attached to the tip portions of the arm bodies 22 of the transfer robot 7 at intervals in the vertical direction so that they can be individually operated. In attaching two fingers in the vertical direction, two holding fingers 21 of the present invention may be provided, or two fingers may consist of one holding finger 21 of the present invention and one known finger 72 having no substitution function with inert gas. In the transfer robot 7a in which the upper and lower fingers are both used as the holding finger 21 of the present invention, it is preferable to use separately the holding finger 21 for transferring the semiconductor wafer W before processing and the holding finger 21' for transferring the processed semiconductor wafer W'. See FIG. 14(a) In particular, it is desirable to transfer the semiconductor wafer W before processing from the FOUP 2 to the processing device 3 with the holding finger 21 disposed on the upper side, and to transfer the processed semiconductor wafer W' from the processing device 3 to the FOUP 2 with the lower holding finger 21'. This is to prevent the reaction gas and dust remaining on the surface of the processed semiconductor wafer W' from adhering to the semiconductor wafer W before processing.

Figure 14B:
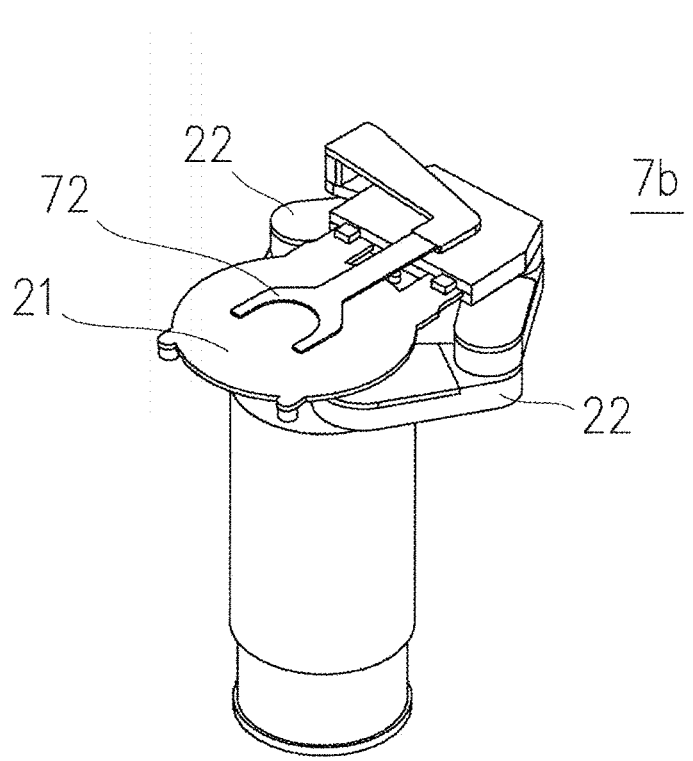

Similarly, in the transfer robot 7b in which one side is the holding finger 21 of the present invention and the other side is the known finger 72, it is desirable to transfer as ejecting the inert gas on the processing surface of the semiconductor wafer W by using the known finger 72 having no replacement function on transferring the semiconductor wafer W before processing from the FOUP 2 to the processing device 3, and by using the holding finger 72 of the present invention on transferring the processed semiconductor wafer W' from the processing device 3 to the FOUP 2. See FIG. 14(b) With the above configuration, the semiconductor wafer W before processing supported by the known finger 72 can be transferred in a clean state.

INDUSTRIAL APPLICABILITY

By holding the thin-plate substrate from the side of the surface to be processed and ejecting inert gas toward the surface to be processed, the thin-plate substrate can be transferred in a state that the surface to be processed is locally atmosphere-replaced without replacing the entire transfer space of the thin-plate substrate with the atmosphere.

DESCRIPTION OF SYMBOLS 1 processing system
2 FOUP
2a wall surface
3 processing device 4 EFEM
5 load port
5' load port with replacement function
6 mini environment space
7, 7a, 7b transfer robot
8 FFU
9 transfer chamber
10 vacuum transfer robot
11 processing chamber
12 load lock chamber
13 slit valve
14 gate valve
15 frame
16 wall member
17 fan
18, 70 filter
19 bracket
20 plate
21, 21a, 21' holding finger
22 arm body
23 base cover
24 base
25 body
26 the first arm
27 body frame
28 body cover
29 the second arm
30 control unit
31 carrier
32 lid
33, 33' shelf board
34, 64 hole
35 lock member
36 latch key
37 retainer
38 suction port
38' suction nozzle
39, 65a, 65b supply port
39 supply nozzle
40, 40' 45 space
41 stage
42 FIMS door
43 lid opening/closing mechanism
46, 46' flow path
47 finger body
47a upper member
47b lower member
48 ejection port (through hole)
48a, 48b ejection port
49, 49' abutting member
49a, 57a notch
50 clamp mechanism
51 piping member
52 joint member
53 purge part
54 locking portion
55 base
56 wrist block
57 clamp member
58 push rod
59 electromagnetic valve
60 fixing member
62 moving member
63 piston rod
65 air cylinder
66 transmitted light sensor
67 sensor dog
68 shield member
69 joint
71 sheet-like filter
72 known finger having no replacement function
73a, 73b pipe
C center line
M1, M2, M3, M4 motor
W semiconductor wafer
W processed semiconductor wafer

The invention claimed is:
1. A thin-plate substrate holding finger for holding a thin-plate substrate during movement between a processing device and a container for storing a plurality of thin-plate substrates in a horizontal state with a surface of the thin-plate substrate to be processed or which has been processed facing upwardly and for ejecting an inert gas to the upwardly facing surface of the thin-plate substrate to be processed or which has been processed, comprising:
a finger body being internally formed with only a flow path for circulating the inert gas;
the finger body being provided with a purge portion for ejecting the inert gas on a thin plate substrate held by the holding finger, said purge portion having a plurality of ejection ports communicating with the flow path and being disposed on a surface of the finger body opposing the upwardly facing surface to be processed or which has been processed of the thin-plate substrate held by the holding finger for ejecting the inert gas onto the entire surface to be processed or which has been processed of the thin-plate substrate held by the holding finger and filling the space formed by the holding finger between the entire surface to be processed or which has been processed of the thin-pate substrate held by the holding finger and the holding finger;
a piping member providing communication between an inert gas supply source and the flow path;
an abutting member being disposed on the surface of the finger body on which said plurality of the ejection ports are formed, and said abutting member being configured to abut a peripheral portion of the thin-plate substrate;
a clamp member being disposed to be movable forward and backward with respect to the thin-plate substrate for abutting the peripheral portion of the thin-plate substrate; and
a clamp mechanism for moving the clamp member forward and backward.
2. The thin-plate substrate holding finger as claimed in claim 1, wherein a dimension in a vertical direction including the finger body and the abutting member is smaller than a pitch dimension in a vertical direction of shelf boards on which the thin-plate substrate is configured to be placed when stored, said shelf boards being formed in the container for storing the thin-plate substrate.
3. The thin-plate substrate holding finger as claimed in claim 2, wherein said purge portion is formed in a disk shape having a diameter substantially the same as a diameter of the thin-plate substrate.
4. The thin-plate substrate holding finger as claimed in claim 2, wherein a filter is provided between the flow path of the finger body and the plurality of ejection ports.
5. The thin-plate substrate holding finger as claimed in claim 2, wherein the plurality of ejection ports are configured to be inclined toward an outside of the thin-plate substrate when held by the thin-plate substrate holding finger.

6. The thin-plate substrate holding finger as claimed in claim 1, wherein said purge portion is formed in a disk shape having a diameter substantially the same as a diameter of the thin-plate substrate.

7. The thin-plate substrate holding finger as claimed in claim 6, wherein a shield member is provided around the purge portion, said shield member covering a space formed between the purge portion and the thin-plate substrate, and configured to discharge the inert gas filled in the space downward from the peripheral portion of the thin-plate substrate.

8. The thin-plate substrate holding finger as claimed in claim 6, wherein a filter is provided between the flow path of the finger body and the plurality of ejection ports.

9. The thin-plate substrate holding finger as claimed in claim 1, wherein a filter is provided between the flow path of the finger body and the plurality of ejection ports.

10. The thin-plate substrate holding finger as claimed in claim 9, wherein a shield member is provided around the purge portion, said shield member covering a space formed between the purge portion and the thin-plate substrate, and configured to discharge the inert gas filled in the space downward from the peripheral portion of the thin-plate substrate.

11. The thin-plate substrate holding finger as claimed in claim 1, wherein the plurality of the ejection ports are configured to be inclined toward an outside of the thin-plate substrate when held by the thin-plate substrate holding finger.

12. The thin-plate substrate holding finger as claimed in claim 1, wherein at least one of the plurality of ejection ports is also provided on the abutting member, and the flow path also communicates with the at least one of the plurality of ejection ports formed on the abutting member.

13. A thin-plate substrate transfer robot, comprising:
an arm body including a thin-plate substrate holding finger on a tip of the arm body, the thin-plate substrate holding finger including the following:
 a finger body being internally formed with only a flow path for circulating an inert gas,
 the finger body being provided with a purge portion for ejecting the inert gas on a thin-pate substrate held by the holding finger, said purge portion having a plurality of ejection ports communicating with the flow path and being disposed on a surface of the finger body opposing an upwardly facing surface to be processed of the thin-plate substrate held by the holding finger for ejecting the inert gas onto the entire upwardly facing surface to be processed of the thin-plate substrate held by the holding finger and filling the space formed by the holding finger between the entire upwardly facing surface to be processed of the thin-plate substrate held by the holding finger and the holding finger;
 a piping member providing communication between an inert gas supply source and the flow path;
 an abutting member being disposed on the surface of the finger body on which the plurality of ejection ports are formed, said abutting member being configured to abut a peripheral portion of the thin-plate substrate;
 a clamp member being disposed to be movable forward and backward with respect to the thin-plate substrate; and
 a clamp mechanism for moving the clamp member forward and backward;
an arm body drive mechanism for operating the arm body in a horizontal plane; and
an elevating mechanism for moving up and down the arm body in a vertical direction.

14. The thin-plate substrate transfer robot as claimed in claim 13, further comprising a pressure accumulator.

15. The thin-plate substrate transfer robot as claimed in claim 13, wherein a dimension in a vertical direction including the finger body and the abutting member is smaller than a pitch dimension in a vertical direction of shelf boards on which the thin-plate substrate is configured to be placed when stored, said shelf boards being formed in a container for storing the thin-plate substrate.

16. The thin-plate substrate transfer robot as claimed in claim 13, wherein said purge portion is formed in a disk shape having a diameter substantially the same as a diameter of the thin-plate substrate.

17. The thin-plate substrate transfer robot as claimed in claim 13, wherein a filter is provided between the flow path of the finger body and the plurality of ejection ports.

18. The thin-plate substrate transfer robot as claimed in claim 13, wherein a shield member is provided around the purge portion, said shield member covering a space formed between the purge portion and the thin-plate substrate, and configured to discharge the inert gas filled in the space downward from the peripheral portion of the thin-plate substrate.

19. A thin-plate substrate transfer device, comprising;
a transfer space in which a thin-plate substrate transfer robot is disposed, said thin-plate substrate transfer robot including the following:
an arm body including a thin-plate substrate holding finger on a tip of the arm body, the thin-plate substrate holding finger including the following:
 a finger body being internally formed with only a flow path for circulating an inert gas,
 the finger body being provided with a purge portion for ejecting the inert gas on a thin-plate substrate held by the holding finger, said purge portion having a plurality of ejection ports communicating with the flow path and being disposed on a surface of the finger body opposing an upwardly facing surface to be processed of the thin-plate substrate held by the holding finger for ejecting the inert gas onto the entire upwardly facing surface to be processed of the thin-plate substrate held by the holding finger and filling the space formed by the holding finger between the entire upwardly facing surface to be processed of the thin-plate substrate held by the holding finger and the holding finger;
 a piping member providing communication between an inert gas supply source and the flow path;
 an abutting member being disposed on the surface of the finger body on which the plurality of ejection ports are formed, and said abutting member being configured to abut a peripheral portion of the thin-plate substrate;
 a clamp member being disposed to be movable forward and backward with respect to the thin-plate substrate; and
 a clamp mechanism for moving the clamp member forward and backward;
an arm body drive mechanism for operating the arm body in a horizontal plane; and
an elevating mechanism for moving up and down the arm body in a vertical direction;

a transfer space forming member for forming the transfer space;

a lid opening/closing device for opening and closing a lid for airtightly closing a closed container, being fixed to the transfer space forming member, said closed container for containing the thin-plate substrate being placed at a predetermined position;

a fan filter unit (FFU) for supplying clean air to the transfer space as a downflow, provided on an upper part of the transfer space forming member, and wherein a floor surface of the transfer space is provided with an opening for discharging the clean air supplied from the FFU.

20. The thin-plate substrate transfer device according to claim 19, further comprising a pressure accumulator.

* * * * *